(12) United States Patent
Tian et al.

(10) Patent No.: US 12,387,782 B2
(45) Date of Patent: Aug. 12, 2025

(54) FAST DIRECT LOOK AHEAD READ MODE IN A MEMORY DEVICE

(71) Applicant: Western Digital Technologies, Inc., San Jose, CA (US)

(72) Inventors: Xuan Tian, Shanghai (CN); Liang Li, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 173 days.

(21) Appl. No.: 18/356,774

(22) Filed: Jul. 21, 2023

(65) Prior Publication Data

US 2024/0144996 A1   May 2, 2024

Related U.S. Application Data

(60) Provisional application No. 63/419,432, filed on Oct. 26, 2022.

(51) Int. Cl.
| | |
|---|---|
| *G11C 11/4096* | (2006.01) |
| *G11C 11/408* | (2006.01) |
| *G11C 11/4094* | (2006.01) |

(52) U.S. Cl.
CPC ...... *G11C 11/4096* (2013.01); *G11C 11/4085* (2013.01); *G11C 11/4094* (2013.01)

(58) Field of Classification Search
CPC .................................................. G11C 11/4094
See application file for complete search history.

(56) References Cited

U.S. PATENT DOCUMENTS

| | | | |
|---|---|---|---|
| 7,310,272 B1 | 12/2007 | Mokhlesi et al. | |
| 7,876,611 B2* | 1/2011 | Dutta | G11C 11/5642 365/185.02 |
| 9,123,425 B2 | 9/2015 | Dong et al. | |
| 9,202,579 B2 | 12/2015 | Hsiung et al. | |
| 10,930,355 B2* | 2/2021 | Yang | G11C 16/3445 |
| 11,024,393 B1* | 6/2021 | Zhang | G11C 16/0483 |
| 11,238,933 B2 | 2/2022 | Joe | |
| 2006/0285391 A1* | 12/2006 | Cernea | G11C 16/26 365/185.22 |
| 2010/0329010 A1* | 12/2010 | Dong | G11C 16/3418 365/185.17 |
| 2013/0185598 A1 | 7/2013 | Haratsch et al. | |
| 2014/0254262 A1 | 9/2014 | Chen et al. | |
| 2017/0140814 A1 | 5/2017 | Puthenthermadam et al. | |
| 2021/0391025 A1* | 12/2021 | Masuduzzaman | G11C 16/0483 |
| 2023/0368846 A1* | 11/2023 | Guo | G11C 16/3459 |

* cited by examiner

*Primary Examiner* — Douglas King
(74) *Attorney, Agent, or Firm* — Pearl Cohen Zedek Latzer Baratz LLP

(57) ABSTRACT

Technology is disclosed herein compensating for neighbor memory cell interference on a target memory cell when reading the target memory cell. The voltage that is applied to the bit line associated with the target memory cell may have a magnitude that depends on the data state of the neighbor memory cell. The magnitude of the voltage on the bit line may impact the amount of drain-induced barrier lowering (DIBL) experienced by the target memory cell. The amount of DIBL may be used to provide a desired amount of compensation for the neighbor memory cell interference. A higher bit line voltage may be used to create a greater amount of DIBL and therefore greater amount of compensation for neighbor memory cell interference.

13 Claims, 17 Drawing Sheets

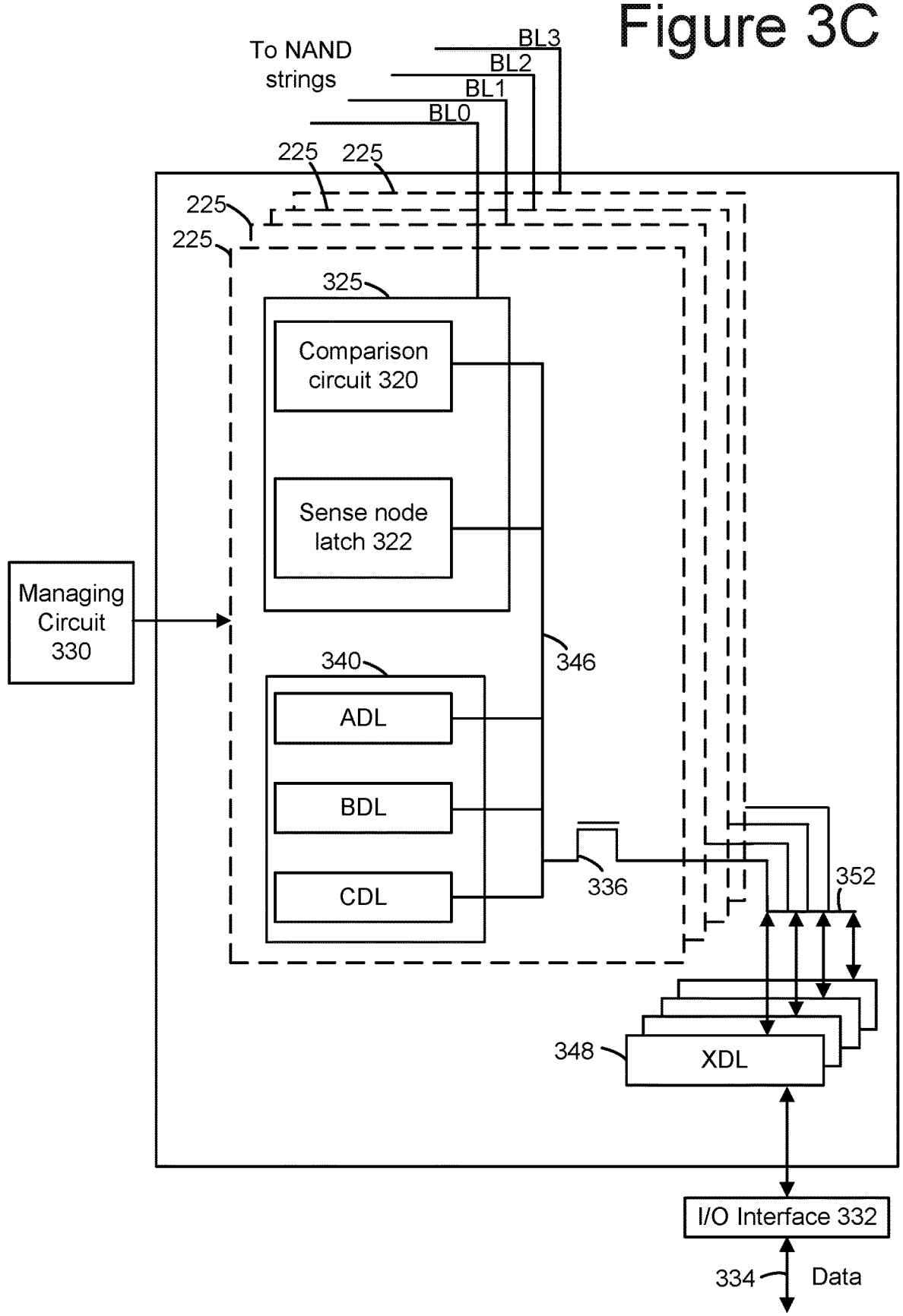

| | WLn+1 | Zone 1 | Zone 2 |
|---|---|---|---|
| WLn | VrA | VBL_Low | VBL_High1 |
| | VrB | | VBL_High2 |
| | VrC | | |
| | VrD | | VBL_High3 |
| | VrE | | |
| | VrF | | VBL_High4 |
| | VrG | | |

| | WLn+1 | Zone 1 | Zone 2 | Zone 3 | Zone 4 |
|---|---|---|---|---|---|
| WLn | VrA | VBL_Z1_Low | VBL_Z2_High1 | VBL_Z3_High1 | VBL_Z4_High1 |
| | VrB | | VBL_Z2_High2 | VBL_Z3_High2 | VBL_Z4_High2 |
| | VrC | | | | |
| | VrD | | VBL_Z2_High3 | VBL_Z3_High3 | VBL_Z4_High3 |
| | VrE | | | | |
| | VrF | | VBL_Z2_High4 | VBL_Z3_High4 | VBL_Z4_High4 |
| | VrG | | | | |

FAST DIRECT LOOK AHEAD READ MODE IN A MEMORY DEVICE

CLAIM OF PRIORITY

The present application claims priority from U.S. Provisional Patent Application No. 63/419,432, entitled "FAST DIRECT LOOK AHEAD READ MODE IN A MEMORY DEVICE," by Tian et al., filed Oct. 26, 2022, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

To read the data back from the memory cells it is typical to use read reference voltages in order to determine what data state a memory cell is presently in. If the Vt of a NAND memory cell is at or below the read reference voltage, the memory cell will conduct a significant current. If the Vt of the NAND memory cell is above the read reference voltage, the memory cell will not conduct a significant current.

Actual and/or apparent shifts in the Vt associated with a target memory cell can occur due to charge associated with a neighbor memory cell. To account for the actual and/or apparent shifts in Vt, compensation may be applied based on different conditions of a neighbor cell. Herein, a "neighbor memory cell" means a cell that is an immediate neighbor to a target memory cell and is on the same NAND string as the target memory cell. Herein, a "neighbor word line" means a word line that is an immediate neighbor to a target word line.

In some cases, programming a neighbor memory cell after finishing programming a target memory cell can alter the apparent Vt of the target memory cell. The aforementioned interference may be referred to herein as near word line interference (NWI). NWI can shift the apparent Vt of the target memory cell due to the electric field introduced by charge injected into a charge trapping layer of the neighbor cell when programming the neighbor cell.

In some cases, the charge that is stored on a neighbor memory cell can alter the actual Vt of a target memory cell. The aforementioned interference may be referred to herein as lateral data retention (lateral DR). Lateral DR may occur from the shifting of trapped electrons or holes from cell to cell or from cell to the area in between the cells. Lateral DR depends on the amount of charge stored in the charge trapping layer of the neighbor memory cell. More charge (and hence higher Vt) results in a greater interference on the target memory cell.

As the distance between memory cells shrinks with each generation of memory systems problems associated with neighbor memory cell interference become worse. Therefore, with each generation it becomes more difficult to maintain a low bit error rate (BER) and good Vt window.

BRIEF DESCRIPTION OF THE DRAWINGS

Like-numbered elements refer to common components in the different figures.

FIG. 3C is a block diagram depicting one embodiment of a portion of column control circuitry that contains a number of read/write circuits.

FIG. 10 is a table that shows an embodiment of bit line voltages for different amount of compensation for neighbor memory cell interference.

FIG. 12 is a table that shows bit line voltages for different amount of compensation for neighbor memory cell interference with the data states of the neighbor cells into four zones.

DETAILED DESCRIPTION

Technology is disclosed herein for a memory system that compensates for neighbor memory cell interference on a target memory cell when reading the target memory cell. In an embodiment, the voltage that is applied to the bit line associated with the target memory cell has a magnitude that depends on the data state of the neighbor memory cell. The magnitude of the voltage on the bit line may impact the amount of drain-induced barrier lowering (DIBL) experienced by the target memory cell. The amount of DIBL may be used to provide a desired amount of compensation for the neighbor memory cell interference. In an embodiment, a higher bit line voltage is used to create a greater amount of DIBL and therefore greater amount of compensation for neighbor memory cell interference. As one example if the neighbor memory cell is in a data state associated with a larger interference then a higher bit line voltage may be used when reading the target memory cell.

Embodiments of a memory system that compensate for neighbor memory cell interference on a target memory cell when reading the target memory cell provide for a fast read operation. Because the voltage to each bit line may be independently controlled different amounts of compensation may be applied at the same time. For example, two different amounts of compensation, four different amounts of compensation, or some other different amounts of compensation may be applied at the same time by suitable voltages applied to the bit lines. In contrast, some conventional techniques for applying compensation for neighbor memory cell interference may apply the compensation to the neighbor word line, which means that only one amount of compensation may be applied at the same time. Other conventional techniques for applying compensation for neighbor memory cell interference may apply the compensation to the target word line, which means that only one amount of compensation may be applied at the same time.

Figure 1:
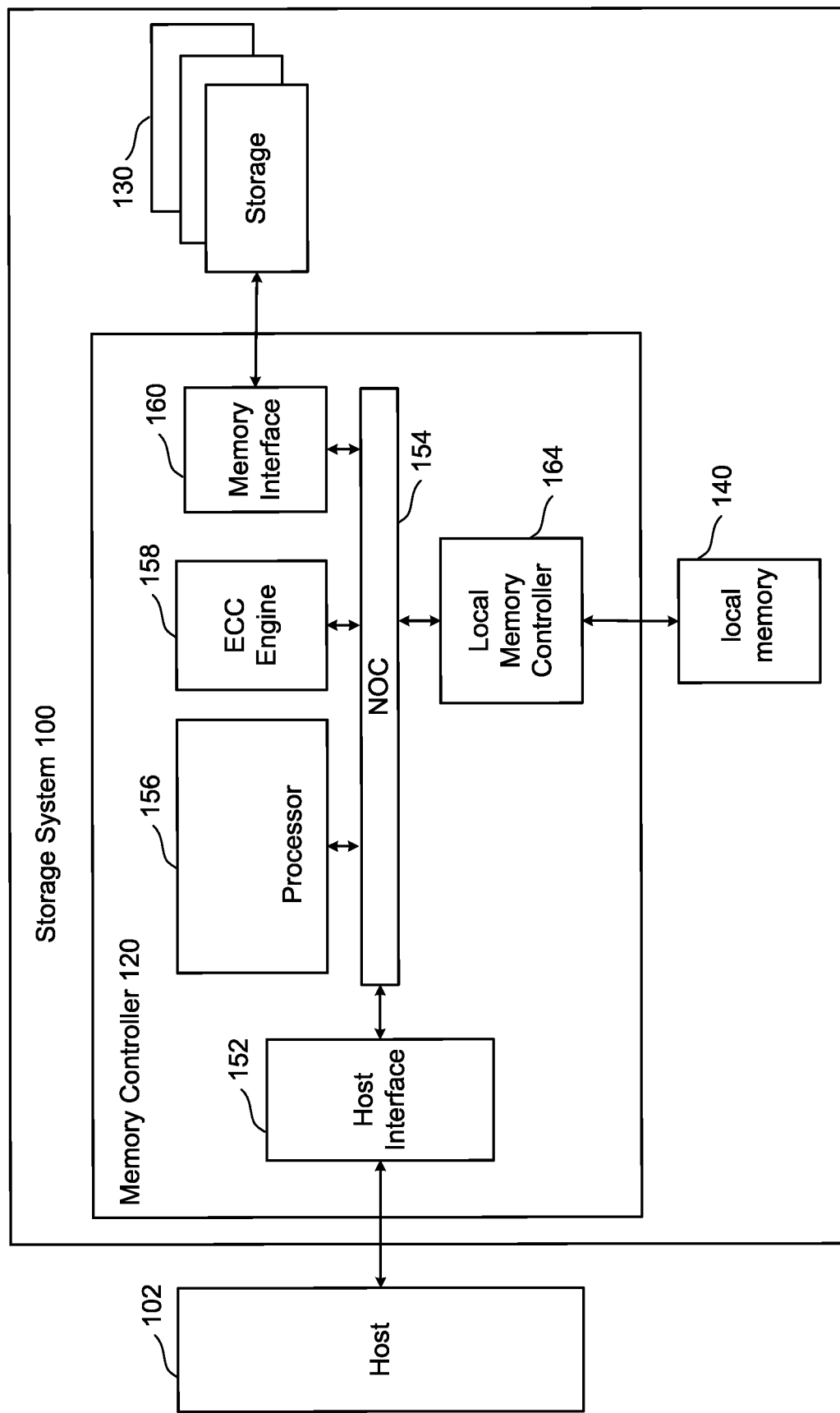
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
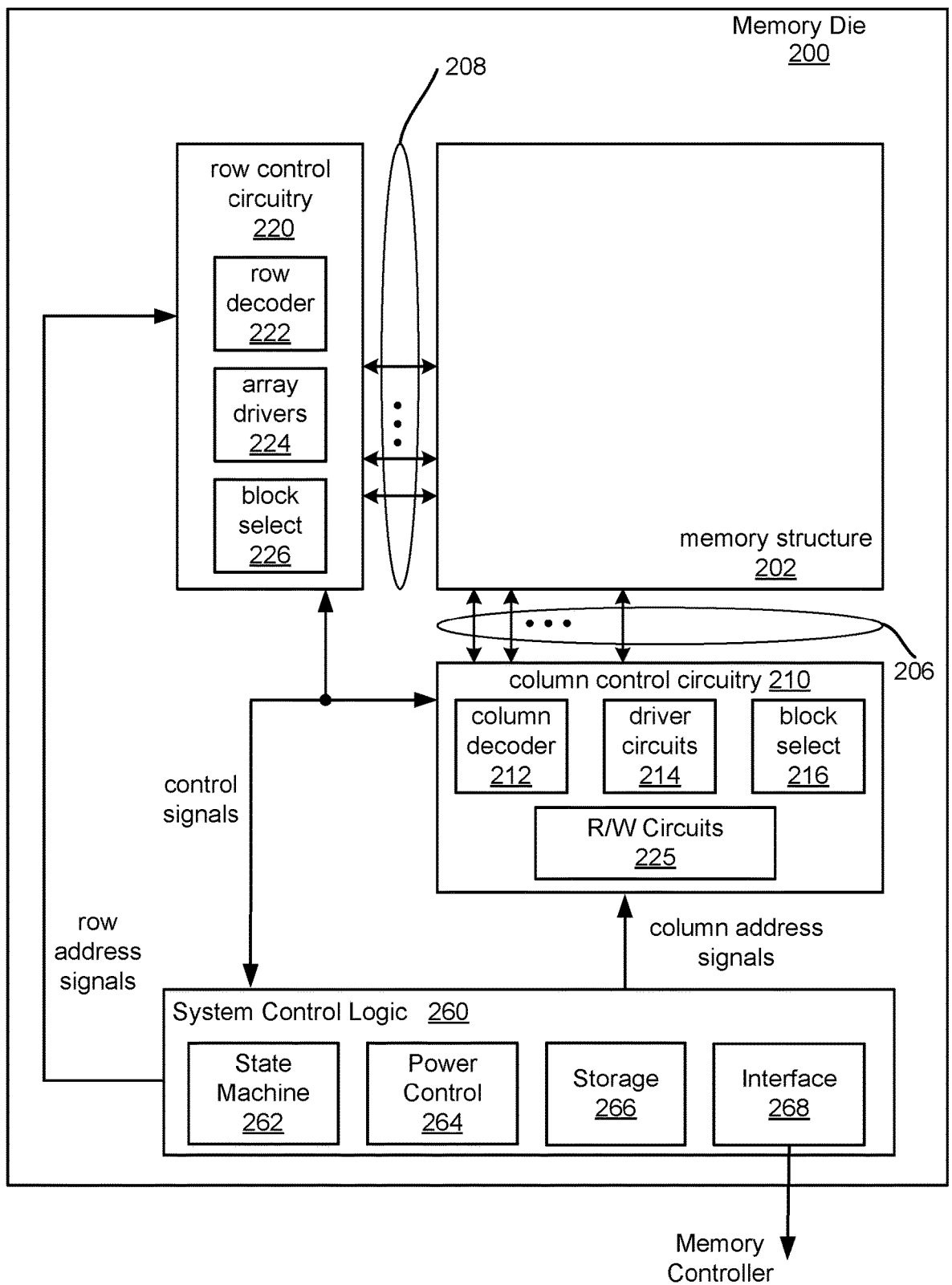
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. Those parameters may include, but are not limited to, voltages to apply to bit lines during a read operation. In an embodiment, the magnitude of the bit line voltage depends on the data state of a neighbor memory cell on the NAND string having the cell being sensed. The neighbor memory cell may be one that was programmed after the cell being sensed.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
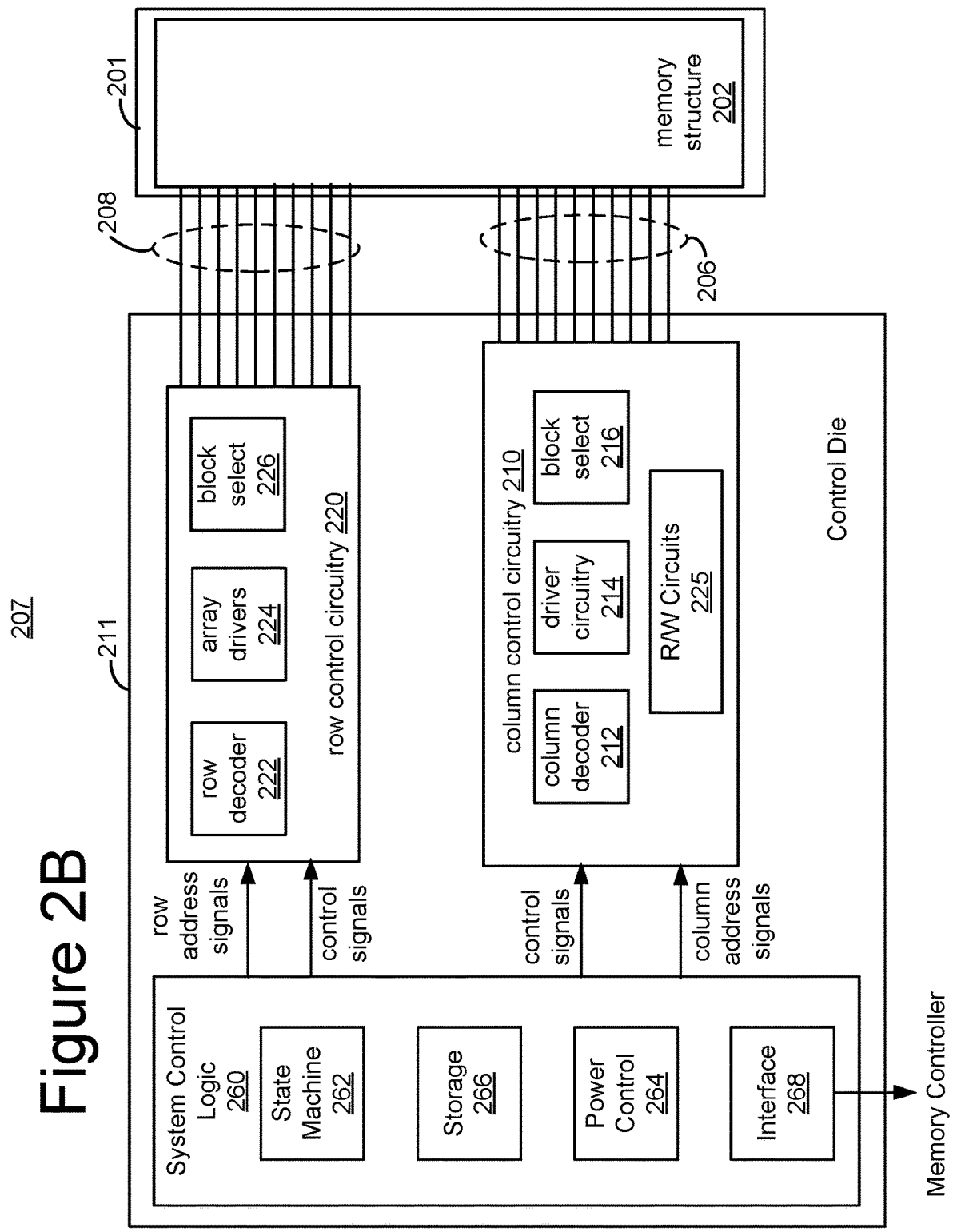
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
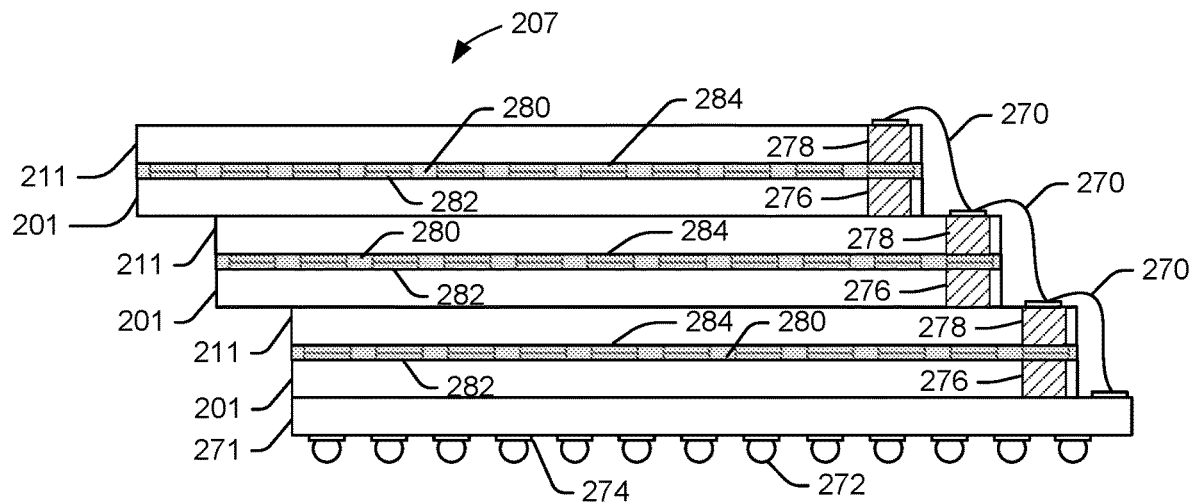
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control die 211 and multiple memory structure die 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
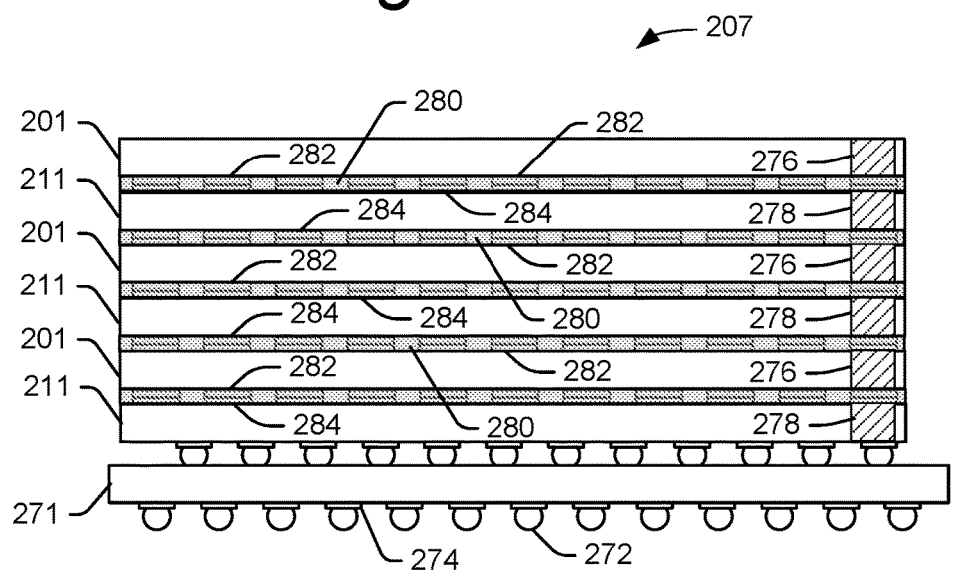

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

FIG. 3C is a block diagram depicting one embodiment of a portion of column control circuitry 210 that contains a number of read/write circuits 225. Each read/write circuit 225 is partitioned into a plurality of sense amplifiers 325 and data latches 340. A managing circuit 330 controls the read/write circuits 225. The managing circuit 330 may communicate with state machine 262. In one embodiment, each sense amplifier 325 is connected to a respective bit line. Each bit line may be connectable, at one point in time, to one of a large number of different NAND strings. A select gate on the NAND string may be used to connect the NAND string channel of one of the NAND strings to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the reference voltage. If the sense node voltage does not decay below Vtrip, the memory cell is in a non-conductive state and its Vth is above the reference voltage. A sense node latch 322 is set to 0 or 1, for example, by the comparison circuit 320 based on whether the memory cell is in a conductive or non-conductive state, respectively.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

The sense amplifier 325 is able to control the magnitude of the voltage on the bit line during sensing. In one embodiment, the magnitude of the bit line voltage will depend on the data state of a neighbor memory cell on the same NAND string having the memory cell being sensed. In an embodiment, this neighbor memory cell was programmed after the cell presently being sensed (e.g., target memory cell). In one embodiment, prior to reading a target memory cell on a NAND string a neighbor memory cell on the same NAND is sensed to determine either its data state or at least what zone of data states it is in. The data latches 340 may be used to store the neighbor state information. When sensing the target memory cell, the information in the data latches 340 may be used to determine the bit line voltage. In this manner the bit line voltage may depend on the neighbor's data state. Therefore, compensation for neighbor cell interference is provided. Moreover, the read process is fast due, at least in part, to the ability to apply different amounts of compensation to different bit lines. In an embodiment, the magnitude of the bit line voltage is selected to create a desired amount of DIBL in the target memory cell.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells has been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate. However, in some embodiments, verify is not performed. If verify is not performed, memory cells may still be locked out after a pre-determined number of pulse have been applied to the cell given the target data state.

Figure 4:
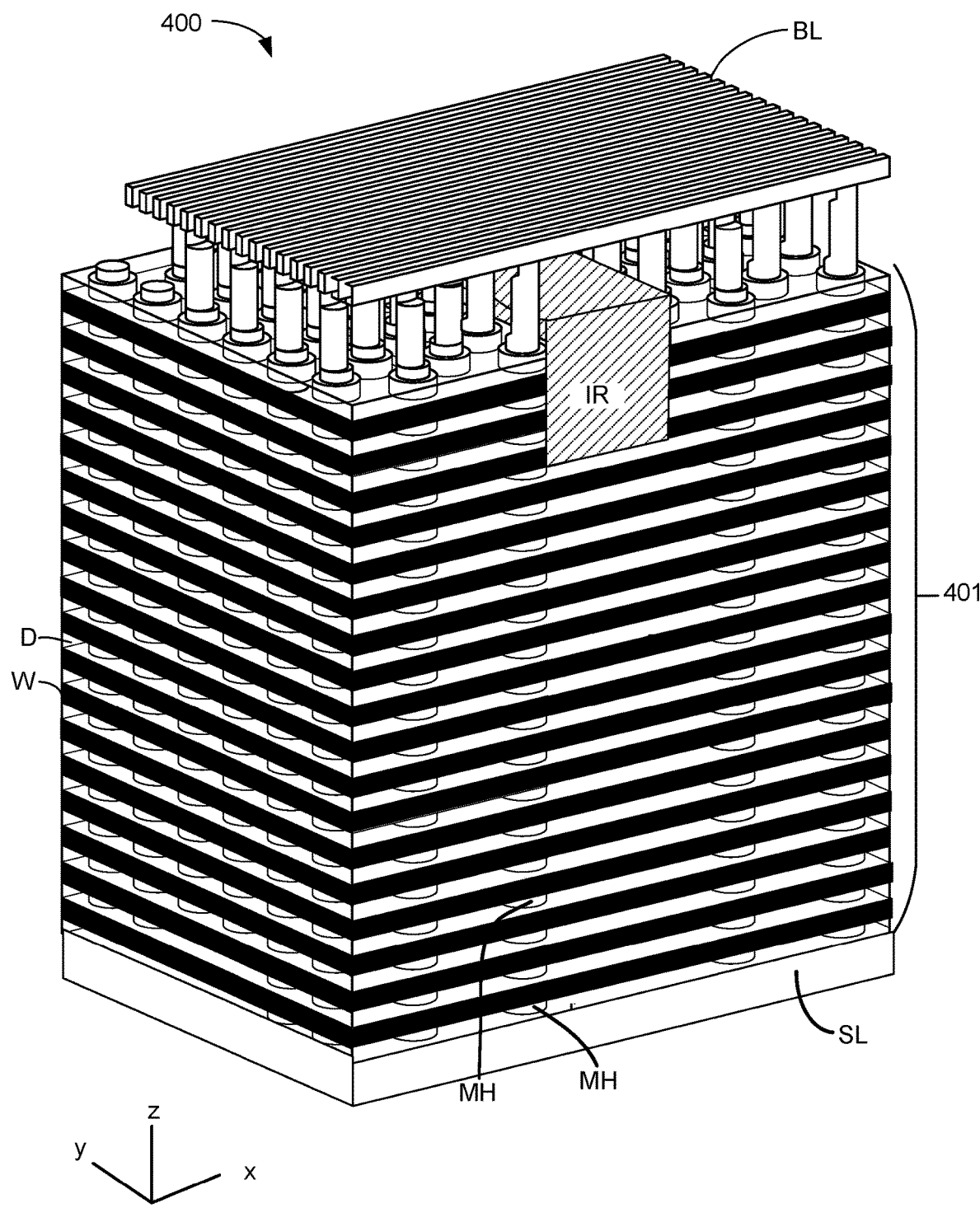
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
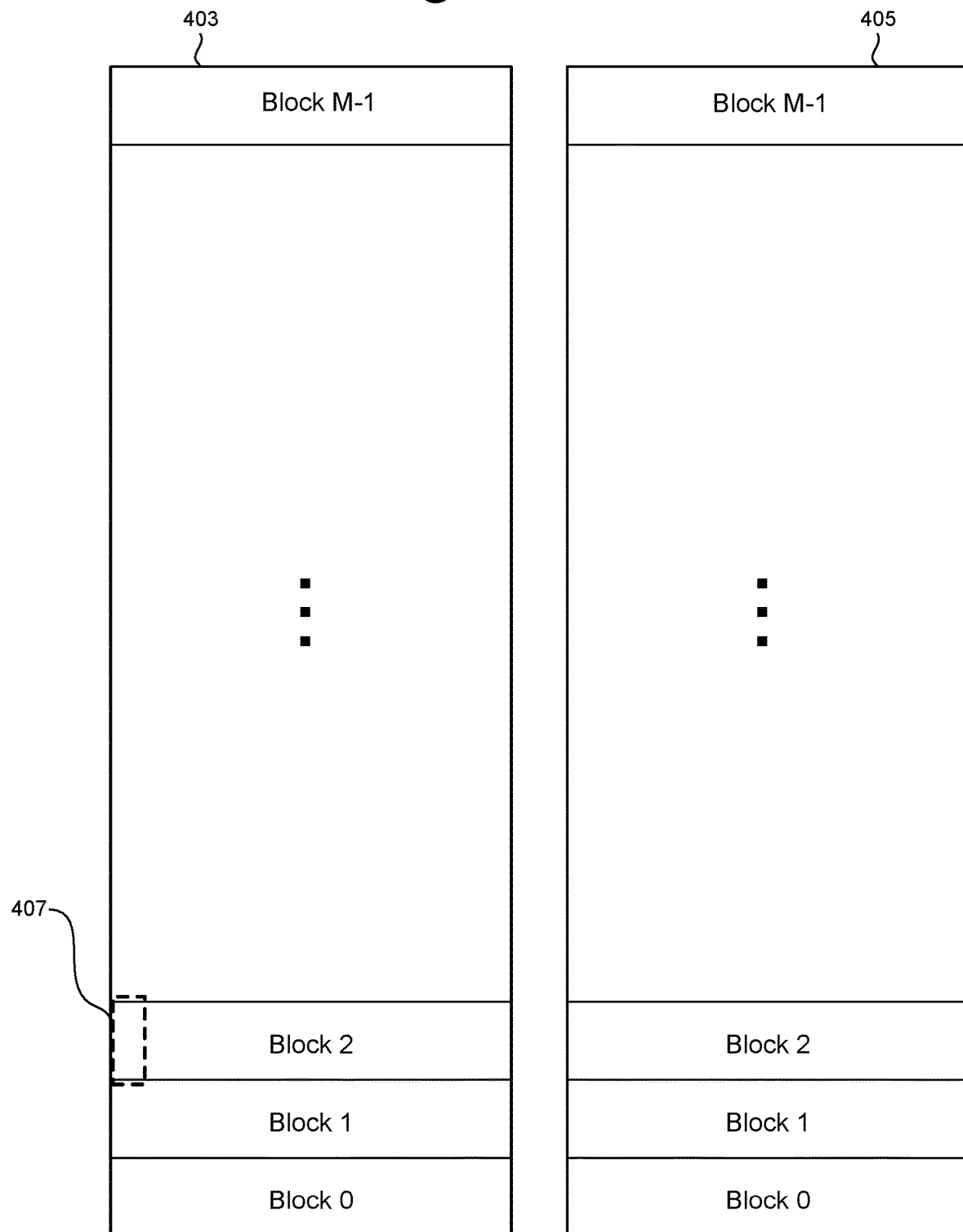
FIG. 4A is a block diagram of one embodiment of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a group of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
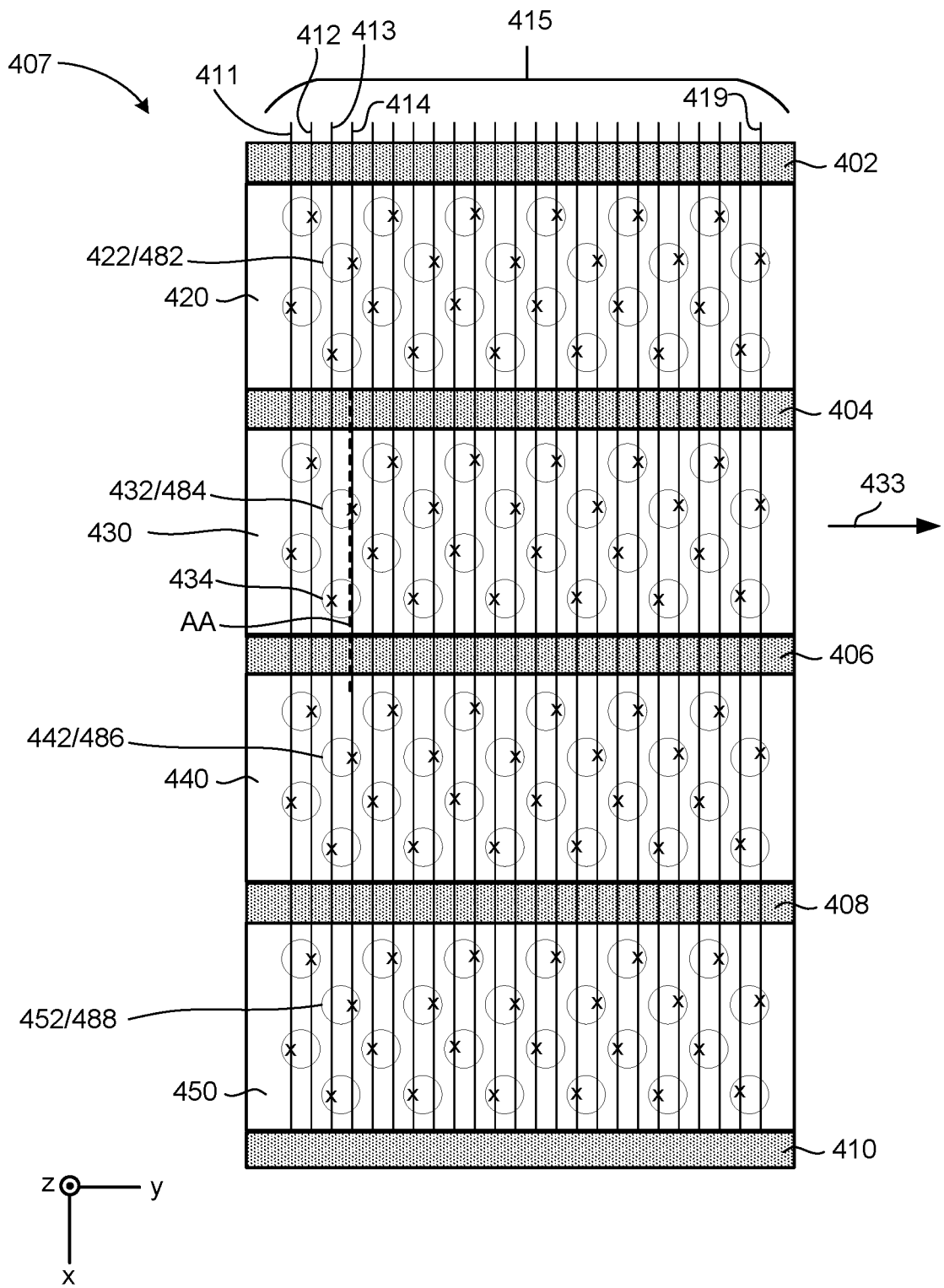
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452. Note that although the columns 422, 432, 442 and 452 are connected to the bit lines, the NAND string channels of NAND strings 482, 484, 486, and 488 are not connected to the bit lines at the same time.

The block depicted in FIG. 4B includes a set of isolation regions 402, 404, 406, 408 and 410, which may be formed of $SiO_2$; however, other dielectric materials can also be used. Isolation regions 402, 404, 406, 408 and 410 serve to divide the top layers of the block into four regions; for example, the top layer depicted in FIG. 4B is divided into regions 420, 430, 440, and 450 of which are referred to as sub-blocks. In one embodiment, isolation regions 402 and 410 separate the block 407 from adjacent blocks. Thus, isolation regions 402 and 410 may extend down to the substrate. In one embodiment, isolation regions 402 and 410 each contain a conductive region (within an insulator) that may be used to transfer a voltage to the source line. In one embodiment, the isolation regions 404, 406, and 408 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, and 450. In that implementation, each block has twenty four rows of active columns and each bit line connects to four rows in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
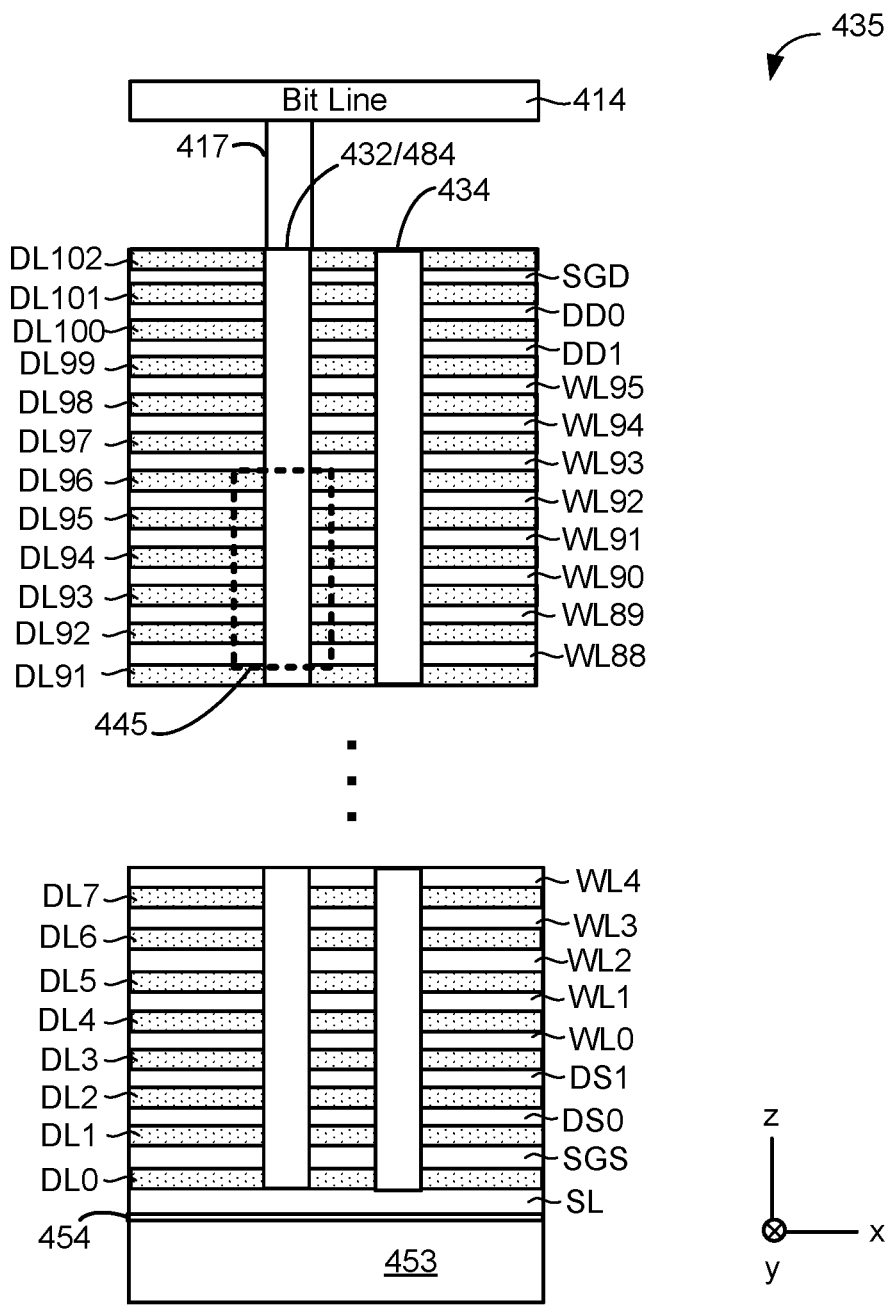
FIG. 4C depicts an embodiment of a stack showing a cross-sectional view along line AA of FIGS. 4A and 4B.

FIG. 4C depicts an embodiment of a stack 435 showing a cross-sectional view along line AA of FIG. 4B. An SGD layer (SGD), an SGS layer (SGS) and four dummy word line layers DD0, DD1, DS1, and DS0 are provided, in addition to the data word line layers WL0-WL95. Each NAND string has a drain side select transistor at the SGD layer. Each NAND string has a source side select transistor at the SGS layer. There may be more than one SGD layer, as well as more than one SGS layer. Also depicted are dielectric layers DL0-DL102.

Columns 432, 434 of memory cells are depicted in the multi-layer stack. The stack includes a substrate 453, an insulating film 454 on the substrate, and a portion of a source line SL. A portion of the bit line 414 is also depicted. Note that vertical column 432 is connected to the bit line 414. Recall that vertical column 432 contains NAND string 484. NAND string 484 has a source-end at a bottom of the stack and a drain-end at a top of the stack. The source-end is connected to the source line SL. A conductive via 417 connects the drain-end of NAND string 484 to the bit line 414. However, note that the channel of NAND string 484 is not necessarily electrically connected to the bit line 414 at all times. Rather, a drain side select gate on NAND string 484 may be used to electrically connect/disconnect the channel of NAND string 484 to/from the bit line 414.

In one embodiment, the memory cells are arranged in NAND strings. The word line layers WL0-WL96 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS is used to electrically connect and disconnect (or cut off) the channels of respective NAND strings from the source line SL.

Figure 4D:
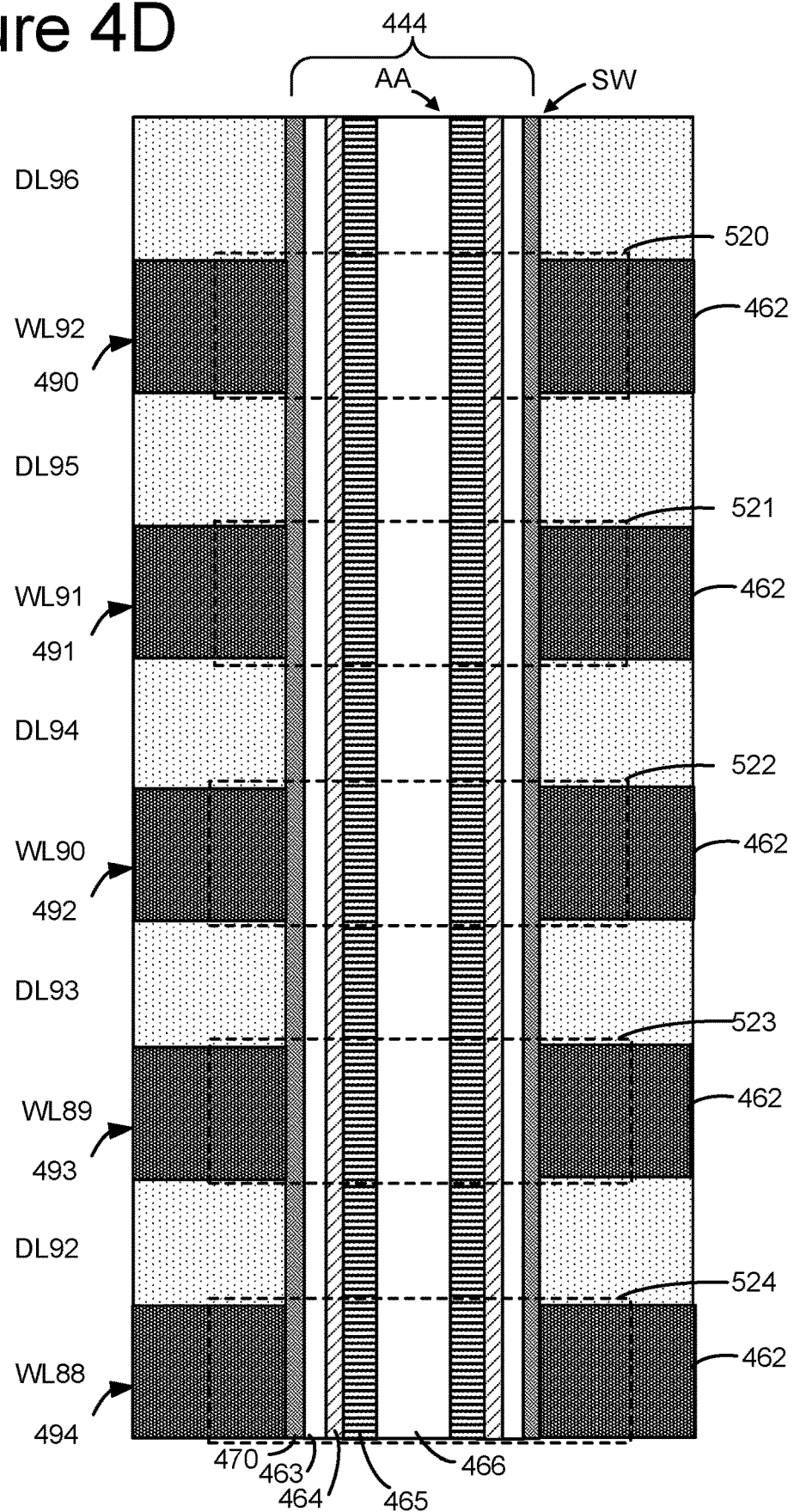
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 444 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
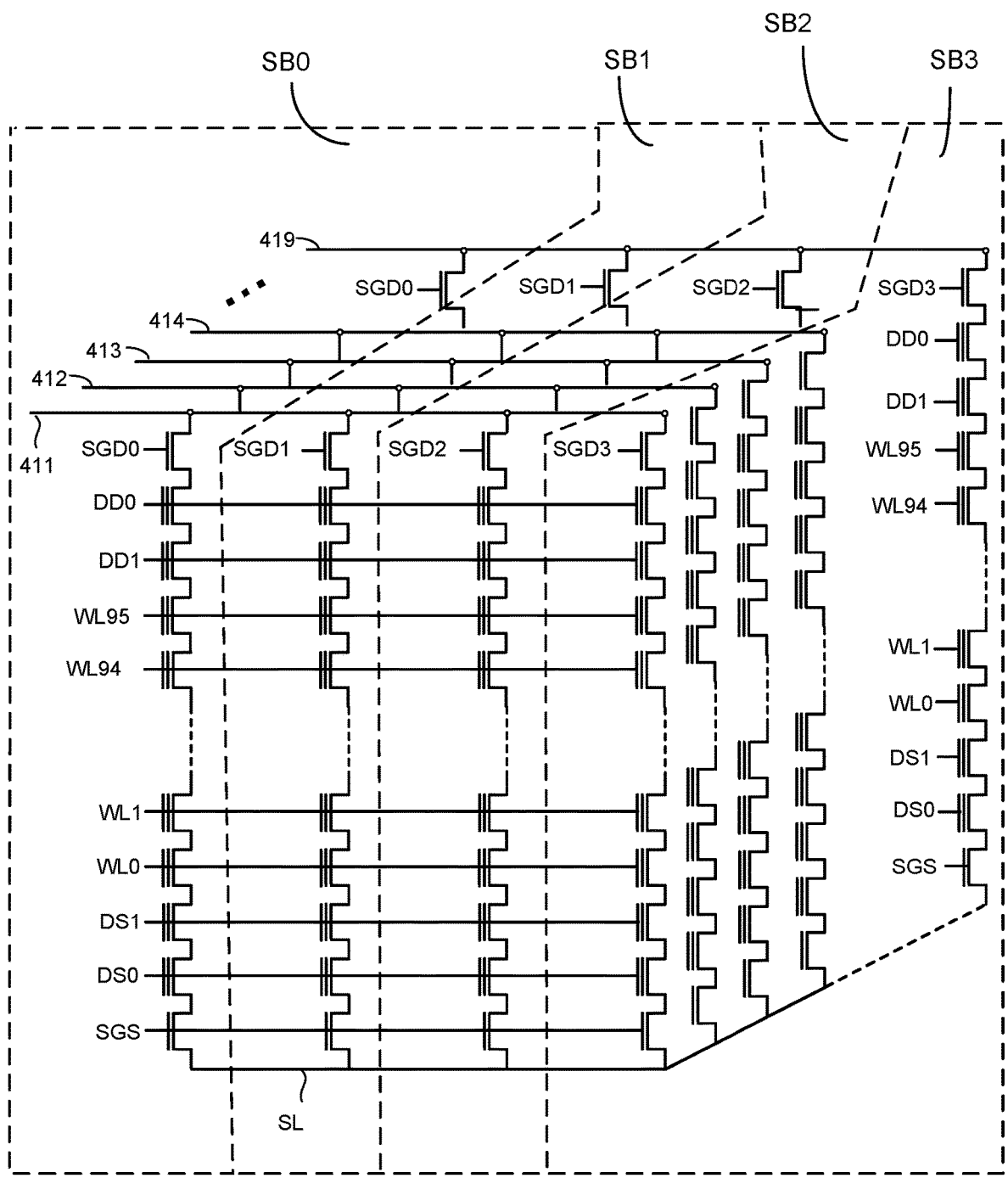
FIG. 4E is a schematic diagram of a portion of one embodiment of a block, depicting several NAND strings.

FIG. 4E is a schematic diagram of a portion of the memory depicted in in FIGS. 4-4D. FIG. 4E shows physical word lines WL0-WL95 running across the entire block. The structure of FIG. 4E corresponds to portion 407 in Block 2 of FIGS. 4A-4D, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). A first sub-block corresponds to those vertical NAND strings controlled by SGD0. A second sub-block corresponds to those vertical NAND strings controlled by SGD1. A third sub-block corresponds to those vertical NAND strings controlled by SGD2. A fourth sub-block corresponds to those vertical NAND strings controlled by SGD4. There may be more or fewer than four sub-blocks in a block.

A source side selection line SGS connects/disconnects the NAND strings to/from the common source line. In some embodiments, there is a source side selection line for each sub-block (similar to the four SGD0, SGD1, SGD2, SGD3). The block can also be thought of as divided into four sub-blocks SB0, SB1, SB2 and SB3. Sub-block SB0 corresponds to those vertical NAND strings controlled by SGD0, Sub-block SB1 corresponds to those vertical NAND strings controlled by SGD1, Sub-block SB2 corresponds to those vertical NAND strings controlled by SGD2, and Sub-block SB3 corresponds to those vertical NAND strings controlled by SGD3.

Although the example memories of FIGS. 4-4E are three dimensional memory structure that includes vertical NAND strings with charge-trapping material, other (2D and 3D) memory structures can also be used with the technology described herein.

Figure 5A:
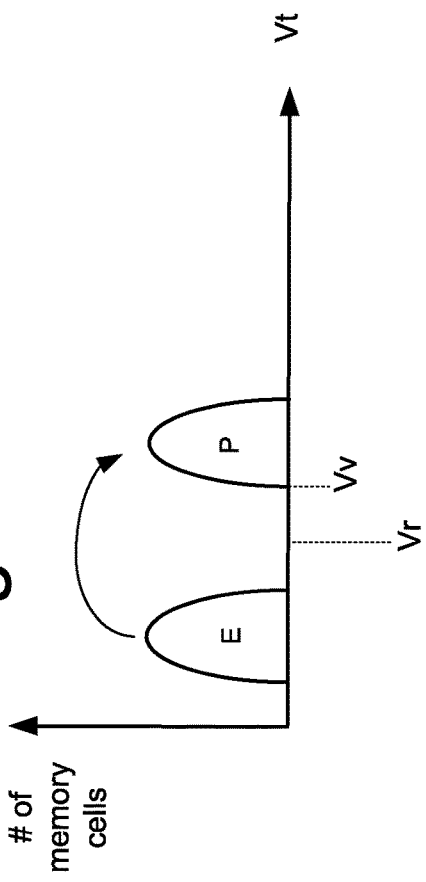
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv. In some embodiments, verify is not performed during SLC programming.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
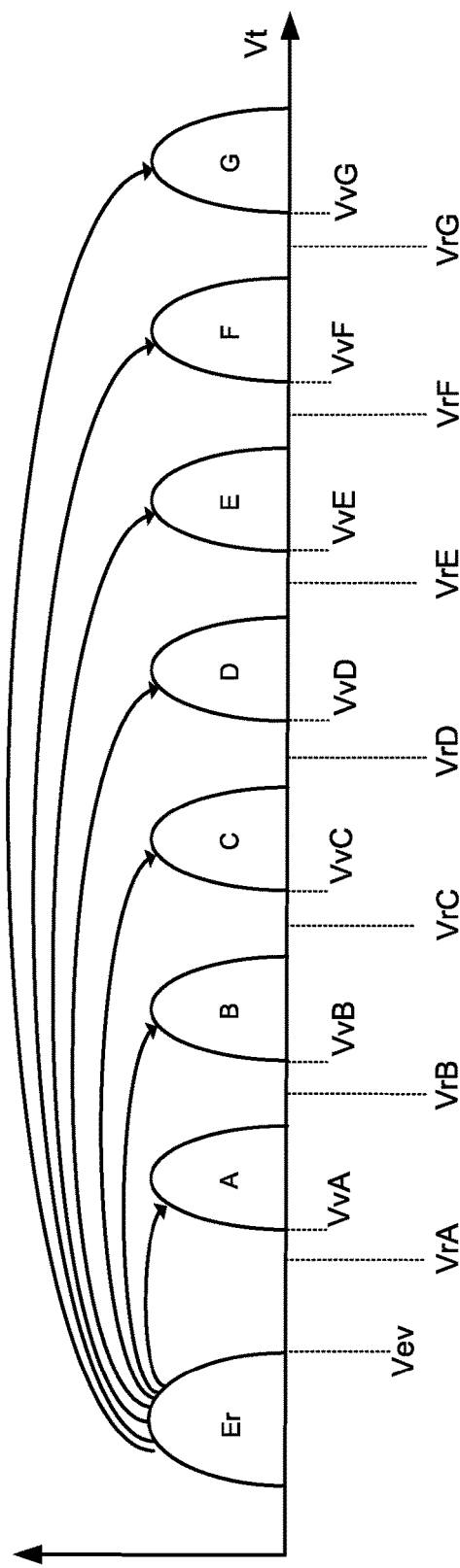

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify high voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states. In some embodiments, verify is not performed during MLC programming.

Figure 6:
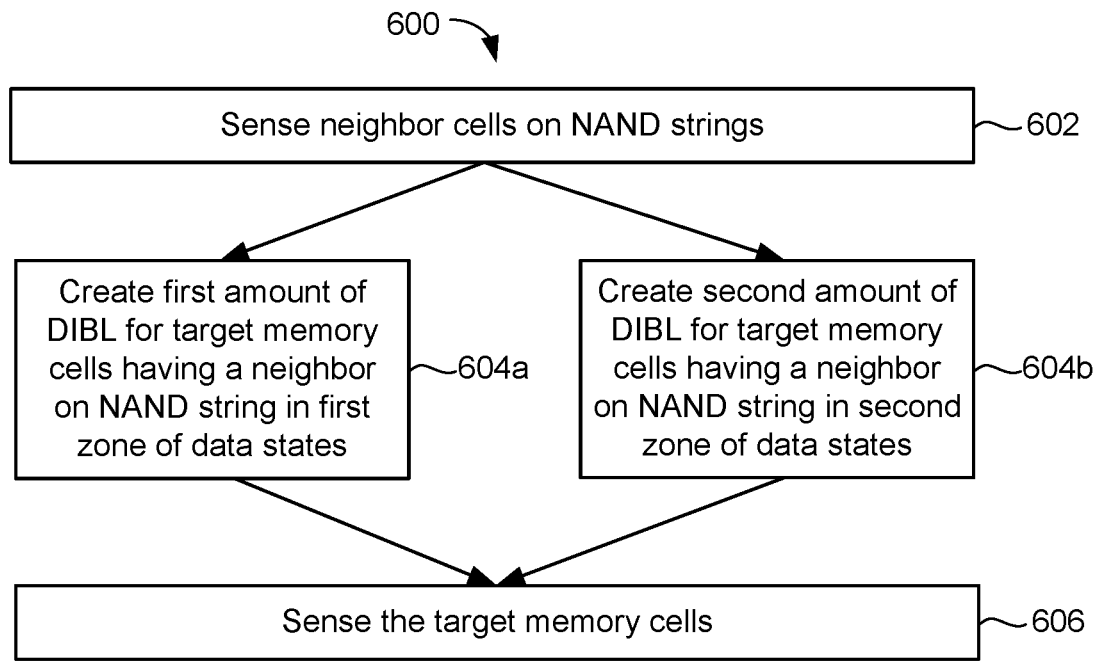
FIG. 6 is a flowchart of one embodiment of a process of reading memory cells while providing drain-induced barrier lowering (DIBL) based compensation for neighbor cell interference.

FIG. 6 is a flowchart of one embodiment of a process 600 of reading memory cells while providing compensation for neighbor cell interference. In an embodiment, the memory cells store multiple bits per cell. An example will be discussed in which the cells store three bits per cell, but process 600 could also be used for reading cells that store two bits per cell, four bits per cell, or even more than four bits per cell. The process 600 may be used to read a group of memory cells that are connected to the same word line. This word line will be referred to as the target word line (e.g., WLn) and the memory cells to be read on the target word line will be referred to as target memory cells. In one embodiment, target memory cells in one sub-block are read (see, for example, SB0, SB1, SB2, SB3 in FIG. 4E). Process 600 may be used to compensate for interference from neighbor memory cells. In particular, a neighbor memory cell on the same NAND string that has the target cell may cause the interface. In one embodiment, the neighbor memory cell is programmed after the target cell. For example, typically NAND cells are programmed one word line at a time. Programming could be performed in an order from the source end of the NAND string towards the drain end or, alternatively, from the drain end to the source end. Also note that in some embodiments one portion of the NAND strings can be programmed source to drain, with another portion programmed drain to source. Herein, some examples will be described in which programming is source to drain, but reading memory cells as described herein is not dependent on that programming order. Thus, with respect to the examples in FIGS. 4C, 4D and 4E, the word lines are programmed from WL0 to WL95, in one embodiment. Process 600 may be performed by, for example, system control logic 260, column control circuitry 210, and/or column control circuitry 220.

Step 602 includes sensing the neighbor memory cells. These neighbor memory cells are connected to a neighbor word line (e.g., WLn+1) that is adjacent to the target word line (e.g., WLn). In an embodiment, these neighbor memory cells were programmed after the target memory cells. In an embodiment in which programming is source-to-drain the neighbor memory cells are connected to WLn+1. The neighbor memory cells are sensed at one or more reference voltages. In one embodiment, the neighbor memory cells are sensed at one reference voltage in order to place each neighbor memory cells into one of two data state zones. A data state zone, as the term is defined herein, contains one or more contiguous data states in terms of threshold voltage distribution. For example, with respect to FIG. 5B a two data state zone example will have a lower zone that contains one or more data states that correspond to the lowest one or more Vt distributions and an upper zone that contains the data states that correspond to the rest of the Vt distributions. In one embodiment, the neighbor memory cells are sensed at three reference voltages in order to place each neighbor memory cells into one of four data state zones.

Step 604a includes creating a first amount of DIBL for target memory cells having a neighbor memory cell on the NAND string in a first zone of data states. Step 604b includes creating a second amount of DIBL for target memory cells having a neighbor memory cell on the NAND string in a second zone of data states. In one embodiment, the DIBL is created based on the voltage applied to the bit line associated with the target memory cell.

Steps 604a and 604b may be performed together. In one embodiment steps 604a and 604b correspond to the two data state zones determined in step 602. In one embodiment in which four data state zones determined in step 602 a third amount of DIBL is created for NAND memory cells having a neighbor memory cell on the NAND string in a third zone of data states and a fourth amount of DIBL is created for NAND memory cells having a neighbor memory cell on the NAND string in a fourth zone of data states. Thus, process 600 may be modified by adding a step for creating a third amount of DIBL for target memory cells having a neighbor memory cell on the NAND string in a third zone of data states and adding a step for creating a fourth amount of DIBL for target memory cells having a neighbor memory cell on the NAND string in a fourth zone of data states. Note that steps 604a and 604b may be performed at the same time, which provides for a fast read while providing for DIBL based compensation for neighbor cell interference.

Step 606 includes sensing the target memory cells. Thus, target memory cells connected to the selected word line are sensed. Step 606 is performed while creating the various amounts of DIBL in steps 604a and 604b. In an embodiment, the target memory cells are sensed while a reference voltage is applied to the selected word line and a voltage is applied to the bit line, wherein the bit line voltage has a magnitude that depends on data state zone of the neighbor cell to target cell.

Figure 7:
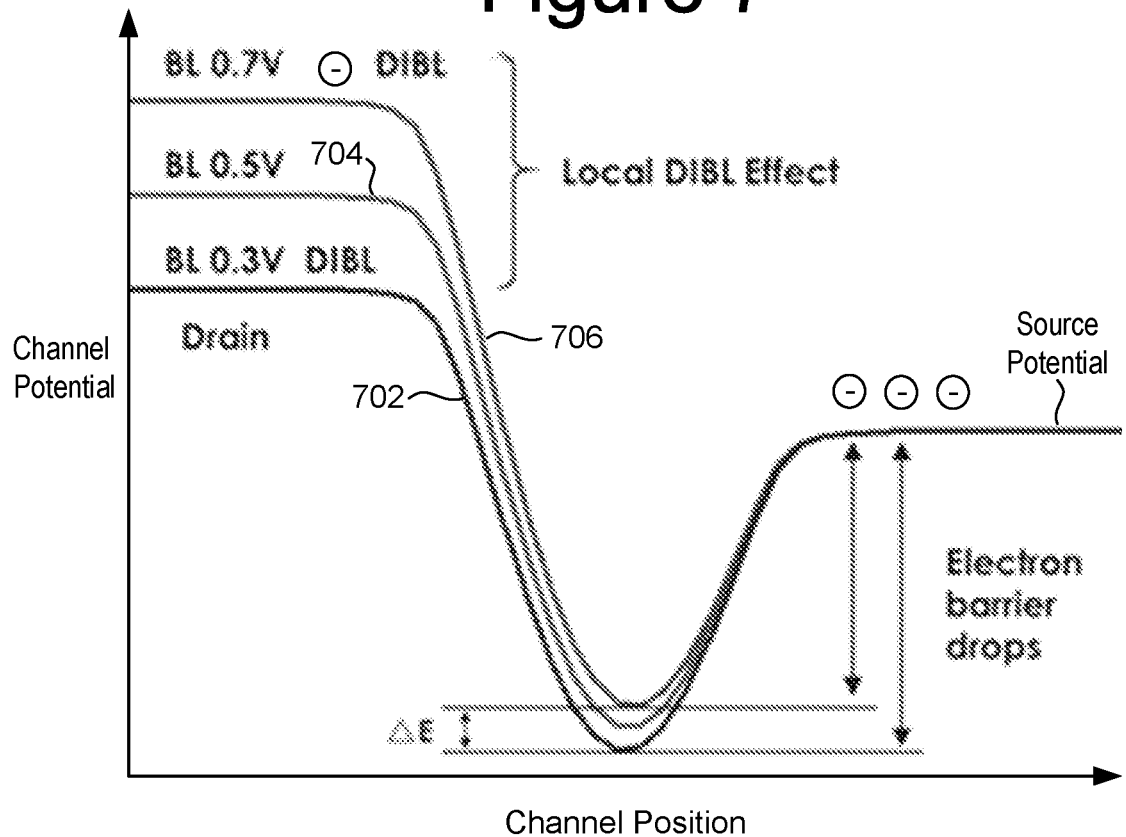
FIG. 7 is a diagram that illustrates curves for a DIBL effect when reading memory cells.

FIG. 7 is a diagram that illustrates curves for a DIBL effect when reading target memory cells. The horizontal axis is the position along the target memory cell channel. The vertical axis is the target memory cell channel potential. The diagram illustrates curves (702, 704, 706) for three different amounts of DIBL, which are created by a corresponding three different bit line voltages. Each curve (702, 704, 706) corresponds to a different bit line voltage (e.g., 0.3V, 0.5V and 0.7V). When sensing a NAND memory cell the bit line voltage may be passed through the NAND string channel to the drain of the target memory cell. The source line voltage is the same for each of the three examples. When sensing a NAND memory cell the source line voltage may be passed through the NAND string channel to the source of the target memory cell. Thus, FIG. 7 shows drain and source voltages for the target memory cell for three cases. The local DIBL effect may result from the different bit line voltages. A higher bit line voltage corresponds to a greater DIBL effect, whereas a lower bit line voltage corresponds to a lower DIBL effect. FIG. 7 shows that the electron barrier is the lowest for curve 706, which corresponds to the greatest DIBL effect.

In the local DIBL effect in a short channel device, a higher drain bias assumes a greater portion of the burden of balancing the depletion region charge, leaving a smaller burden for the gate. In other words, the channel can be opened by a lower voltage, thereby shifting down the threshold voltage. The local DIBL effect is demonstrated in FIG. 7 where the channel potential under the gate is increased with higher bit line bias. Therefore, the barrier of electron transportation from source to drain is reduced (for a higher bit line voltage).

Figure 8:
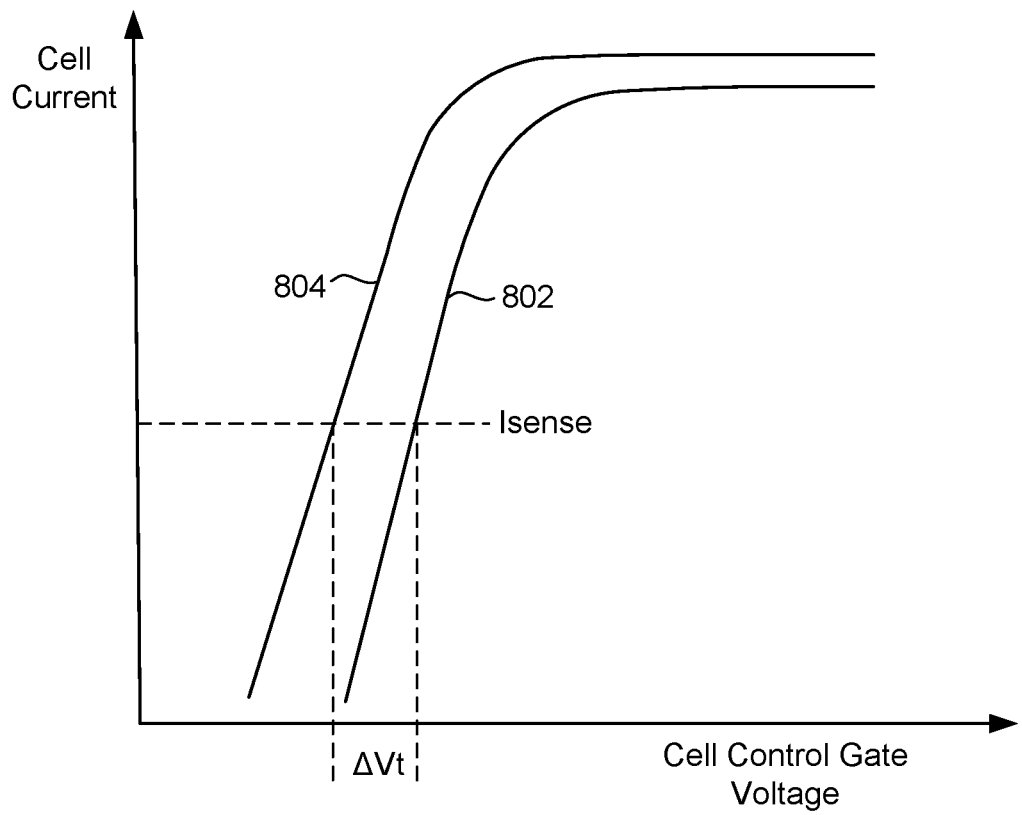
FIG. 8 depicts cell current versus gate voltage for two different BL biases.

FIG. 8 depicts memory cell current versus gate voltage for two different bit line biases. Curve 802 is for a nominal bit line bias. Curve 804 is for a higher than nominal bit line bias. Thus, curve 804 corresponds to a greater DIBL effect than curve 802. The higher bit line bias results in a shifting of Id-Vg current to the left. The dashed line labeled Isense refers to the effective sensing current used by the sense amplifier. The term "effective sensing current" is used to indicate that the sense amplifier need not compare the memory cell's current with an actual reference current, but may, for example, use the memory cell's current to discharge a sense node for a pre-determined period of time (sense time) and compare the resultant voltage on the sense node to a reference voltage. Thus, the sense time and reference voltage may result in an effective sensing current. FIG. 8 shows that assuming the same Isense there is a slightly different Vt for curve 804 than for curve 802. Thus, compensation for a Vt shift in the target memory cells (actual and/or apparent Vt shift) can be achieved by a higher bit line bias.

Figure 9:
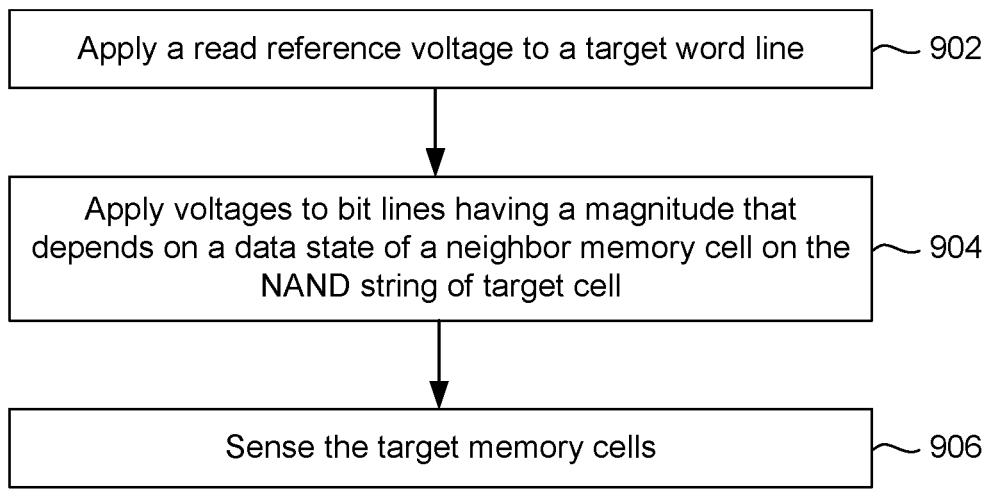
FIG. 9 is a flowchart of one embodiment of a process of reading memory cells using neighbor data state dependent bit line voltages.

FIG. 9 is a flowchart of one embodiment of a process 900 of reading target NAND memory cells while providing compensation for neighbor memory cell interference. In an embodiment, process 900 provides DIBL based compensation. Hence, process 900 provides further details for one embodiment of process 600. Prior to process 900 the neighbor memory cells may be read to determine what data state zone each neighbor memory cell is in. In an embodiment, the neighbor memory cells are programmed after the target memory cells.

Step 902 includes applying a read reference voltage to a target word line (e.g., WLn). The read reference voltage could be one of VrA-VrF with respect to the example in FIG. 5B. Step 904 includes applying voltages to bit lines associated with the target memory cells. The voltage to a bit line has a magnitude that depends on the data state of a neighbor memory cell on the NAND string of the target cell. It is not necessary to determine the exact data state of neighbor memory cell, as the data state zone may be sufficient. Step 906 includes sensing the target memory cells while the read reference voltage is applied to the target word line and the voltages are applied to the bit lines. Note that process 900 may also include other actions such as applying a voltage to the source line associated with the NAND strings having the target memory cells. Also select voltages may be applied to drain side select gates and source side select gates of the NAND strings having the target memory cells.

FIG. 10 is a table 1000 that shows an embodiment of bit line voltages for different amount of bit line based compensation for neighbor memory cell interference. The memory cells each store three bits in this example. The memory cells on WLn may be read at seven different reference voltages VrA-VrG, which corresponds to the example in FIG. 5B. Memory cells are typically read one page at a time using only a subset of the seven reference voltages. The table 1000 is for a one-bit embodiment in which the neighbor's data states are divided into two data state zones. As one example, Zone 1 is for the erase, A-, B-, C-, and D-states and Zone 2 is for the E-, F-, and G-states. However, Zones 1 and 2 can be assigned other contiguous data states. In table 1000, the lowest bit line voltage is VBL_Low, which may correspond to a nominal bit line voltage. The nominal bit line voltage may be the same voltage that is used for a read that does not provide compensation for neighbor cell interference, but that is not a requirement.

Table 1000 shows that if the neighbor cell is in Zone 1 then the bit line voltage is VBL_Low. If the neighbor cell is in Zone 2 then the bit line voltage is one of the VBL_High voltages, which each provide a different amount of DIBL compensation. In an embodiment, the higher bit line voltage, and hence most amount of DIBL, is VBL_High1. VBL_High2, VBL_High3, and VBL_High4 correspond to successively lower bit line voltages and hence provide successively lower amounts of DIBL. Thus, in Zone 2 a greater amount of compensation may be used when the reference voltage applied to the target word line is smaller. Table 1000 shows that the most amount of DIBL is for the case in which the memory cell is being read at VrA and the neighbor cell is in Zone 2. While table 1000 shows four different VBL_High values, more or fewer than four VBL_High values may be used. For example, a different VBL_High value could be used for each reference voltage VrA-VrG. Also, when four different VBL_High values are used the assignments between the reference voltages and VBL_High values can be different than the example in table 1000. Note that table 1000 indicates that for a given reference voltage two different bit line voltages are used, depending on whether the neighbor cell is in Zone 1 or Zone 2. It may be stated that two different amounts of DIBL are used for these two cases.

Figure 11:
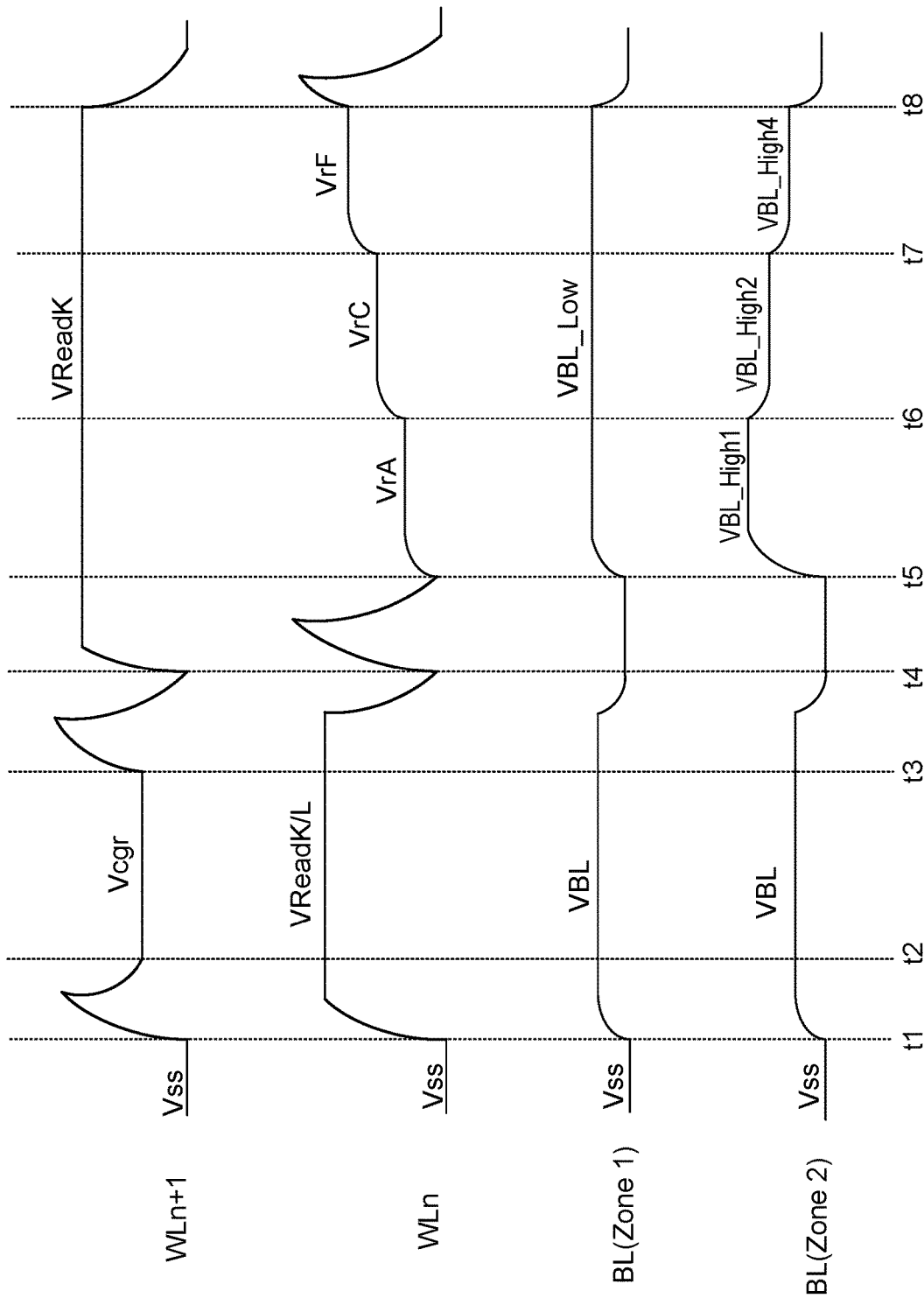
FIG. 11 depicts timing of voltages applied during one embodiment of DIBL biased compensation for neighbor cell interference.

FIG. 11 depicts timing of voltages applied during one embodiment of bit line voltage based compensation for neighbor cell interference. The different values of the bit line voltages may create different amounts of DIBL. The waveforms in FIG. 11 correspond to an embodiment of the values in table 1000. Voltages are depicted for sensing memory cells on the neighbor word line (WLn+1) followed by reading memory cells on word line WLn. The bit lines are divided into Zone 1 and Zone 2, an example of which was discussed with respect to that table 1000 in FIG. 10.

With reference to FIG. 11, prior to time t1 the voltages are all at Vss, which may be 0V. Between time t1 and t2 a read spike voltage is applied to WLn+1. At t1 the voltage on WLn is raised up towards a read pass voltage VReadK/L. At t1 the voltages on all of the bit lines are raised to VBL. In an embodiment, VBL is a nominal sensing voltage. By t2 the voltage on WLn+1 has lowered to a read reference voltage Vcgr. The voltage on WLn+1 is held at Vcgr until t3. The magnitude of the Vcgr is selected to distinguish between Zone 1 and Zone 2. For example, if Zone 1 contains the Er to D-states and Zone 2 contains the E- to G-states, then Vcgr may be VrE (see FIG. 5B). The voltage on WLn is held at VReadK/L at least until t3. VReadK/L is a read pass voltage, which means that it should be higher than the highest Vt of any memory cell on WLn such that these unselected cells on WLn will turn on (act as pass gates). Other unselected word lines will also have read pass voltages applied thereto, although the magnitude of the read pass voltages on the unselected word lines are not all required to be the same. Between t2 and t3 the neighbor memory cells on WLn+1 are sensed. The result of sensing may initially be stored in the sense node latch 322, but may then be transferred to one of the data latches 340 (see FIG. 3C).

Between t3 and t4 another read spike voltage is applied to WLn+1. Also, voltages on WLn and the bit lines are brought back down to Vss by t4. Between t4 and t5 a read spike voltage is applied to WLn. At t4 the voltage on WLn+1 is raised to a read pass voltage VReadK. As with VReadK/L, this read pass voltage should be higher than the highest Vt of any memory cell on WLn+1 such that these unselected cells on WLn+1 will turn on (act as pass gates). However, this read pass voltage may have a different magnitude than the one applied to WLn between t2 and t3.

Between t5 and t8 three different read reference voltages will be applied to WLn. These three read reference voltages (VrA, VrC, VrF) are used to read one of the three pages of data stored in the memory cells on WLn. As one example, this is a middle page of data in an example in which the cells store a lower page, a middle page, and an upper page. At t5 the voltage on WLn is raised towards the first reference voltage VrA. At t5 the voltage on the Zone 1 bit lines are raised to VBL_Low. A Zone 1 bit line is a bit line for which the neighbor cell on WLn+1 is in Zone 1. At t5 the voltage on the Zone 2 bit lines are raised to VBL_High1. A Zone 2 bit line is a bit line for which the neighbor cell on WLn+1 is in Zone 2. Between t5 and t6 the target cells on WLn are sensed while VrA is applied to WLn. Referring back to FIG. 9 note that for Zone 2 the voltage VBL_High1 is applied for VrA.

At t6 the voltage on WLn is raised towards the second reference voltage VrC. At t6 the voltage on the Zone 2 bit lines are lowered to VBL_High2. Between t6 and t7 the target cells on WLn are sensed while VrC is applied to WLn. Referring back to FIG. 9 note that for Zone 2 the voltage VBL_High2 is applied for VrC.

At t7 the voltage on WLn is raised towards the third reference voltage VrF. At t7 the voltage on the Zone 2 bit lines are lowered to VBL_High4. Between t7 and t8 the target cells on WLn are sensed while VrF is applied to WLn. Referring back to FIG. 9 note that for Zone 2 the voltage VBL_High4 is applied for VrF. After sensing each target cell at the three reference voltages a middle page bit may be determined for each target cell.

Therefore, for the example in FIG. 11, three of the four VBL_High voltages are used. Because sensing did not occur at VrD or VrE there was no need to apply VBL_High3 for reading this middle page. However, when reading a page for which VrD or VrE is applied to WLn, VBL_High3 will be applied to the Zone 2 bit lines. Therefore, the lower page and the upper page may be read in a manner similar to that depicted for the middle page example in FIG. 11, with modifications taken from table 1000 depending on what reference voltages are applied to WLn for reading the lower and upper pages. However, note that as mentioned above table 1000 is just one example of how to assign bit line voltages to read reference voltages.

In one embodiment, the memory system divides the data states of the neighbor cells into four zones. FIG. 12 is a table 1200 that shows bit line voltages for different amount of compensation for neighbor memory cell interference with the data states of the neighbor cells into four zones. The memory cells each store three bits in this example. The memory cells on WLn may be read at seven different reference voltages VrA-VrG, which corresponds to the example in FIG. 5B (as well as table 1000 in FIG. 10). The embodiment in table 1200 may be referred to as a two-bit embodiment in which the neighbor's data states are divided into four data state zones. As one example, Zone 1 is for the erase and A states, Zone 2 is for the B and C states, Zone 3 is for the D and E states, and Zone 4 is for the F and G states. However, the zones can be assigned other data states. A zone could be assigned a single data state. In table 1200, the lowest bit line voltage is VBL_Z1_Low, which may correspond to a nominal bit line voltage that does not provide compensation for the neighbor's data state. Table 1200 shows that if the neighbor cell is in Zone 1 then the bit line voltage is VBL_Z1_Low. If the neighbor cell is in Zone 2 then the bit line voltage is one of the four VBL_Z2_High voltages, which each provide a different amount of DIBL compensation. If the neighbor cell is in Zone 3 then the bit line voltage is one of the four VBL_Z3_High voltages, which each provide a different amount of DIBL compensation. If the neighbor cell is in Zone 4 then the bit line voltage is one of the four VBL_Z4_High voltages, which each provide a different amount of DIBL compensation. Similar to the example discussed with respect to table 1000 in FIG. 10, a higher BL voltage results in a greater amount of DIBL.

For a given read reference voltage applied to the target word line the amount of compensation may depend on the Zone in which the neighbor cell resides. For a given read reference voltage applied to the target word line the highest compensation may be provided for Zone 4, followed by Zone 3, followed by Zone 2, with the least competition for Zone 0. For example, in one embodiment, VBL_Z4_High1>VBL_Z3_High1>VBL_Z2_High1>VBL_Z1_Low. Similarly, in one embodiment, VBL_Z4_High2>VBL_Z3_High2>VBL_Z2_High2>VBL_Z1_Low. Similarly, in one embodiment, VBL_Z4_High3>VBL_Z3_High3>VBL_Z2_High3>VBL_Z1_Low. Similarly, in one embodiment, VBL_Z4_High4>VBL_Z3_High4>VBL_Z2_High4>VBL_Z1_Low.

Moreover, for a given Zone in which the neighbor cell resides the amount of compensation may depend on the magnitude of the reference voltage applied to the target word line. Or, stated another way, for a given Zone in which the neighbor cell resides the amount of compensation may depend on the data state associated with the reference voltage applied to the target word line. A greater amount of compensation may be used when the reference voltage applied to the target word line is greater. For example, in one embodiment, VBL_Z2_High1>VBL_Z2_High2>VBL_Z2_High3>VBL_Z2_High4. Similarly, in one embodiment, VBL_Z3_High1>VBL_Z3_High2>VBL_Z3_High3>VBL_Z3_High4. Similarly, in one embodiment, VBL_Z4_High1>VBL_Z4_High2>VBL_Z4_High3>VBL_Z4_High4. While table 1200 shows four different VBL_High values for Zones 2, 3 and 4, more or fewer than four may be used. For example, a different VBL_High value could be used for each reference voltage VrA-VrG.

Figure 13:
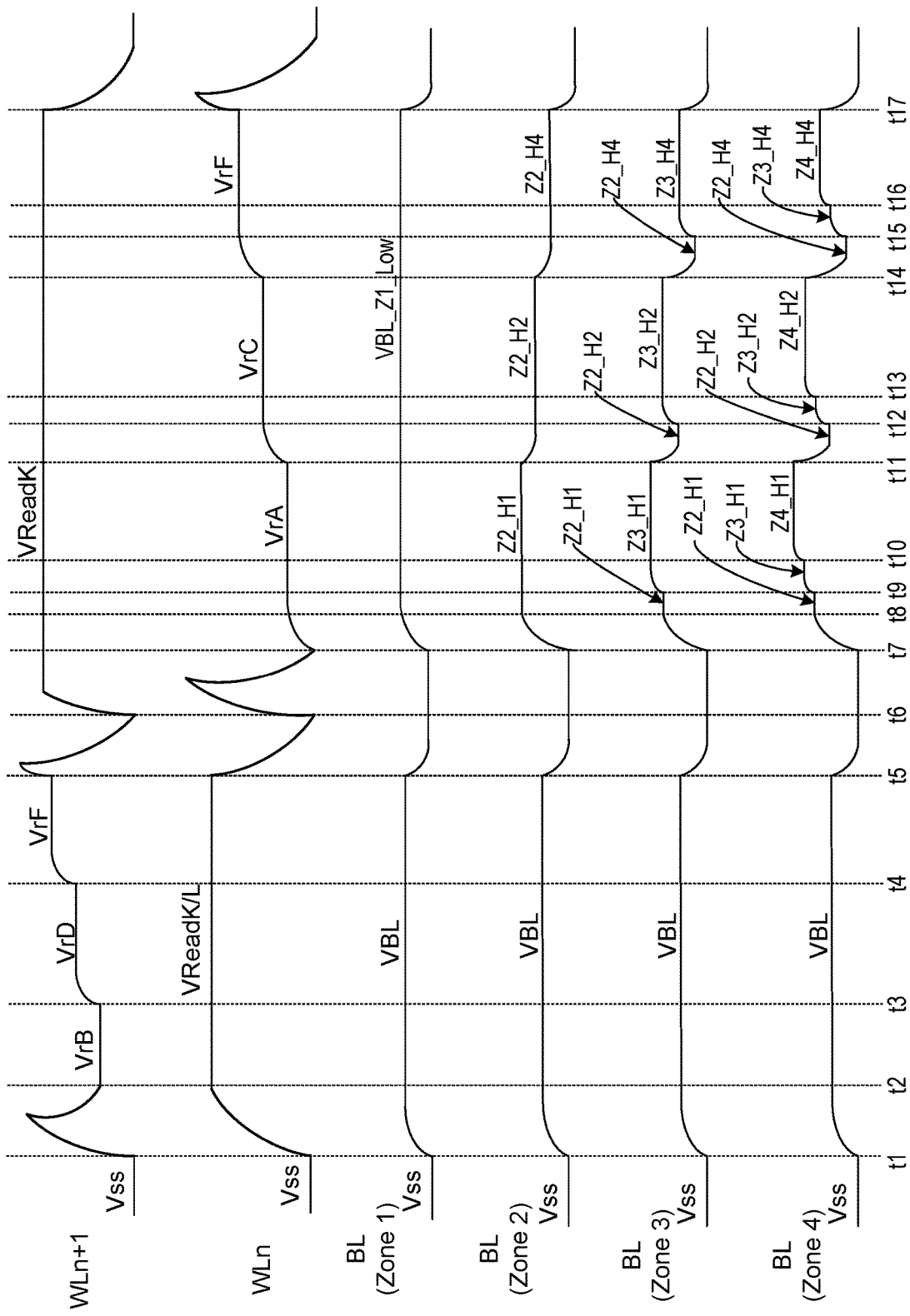
FIG. 13 depicts timing of voltages applied during one embodiment of DIBL biased compensation for neighbor cell interference.

FIG. 13 depicts timing of voltages applied during one embodiment of bit line based compensation for neighbor cell interference. The different bit line voltages may create different amounts of DIBL. The waveforms in FIG. 13 correspond to an embodiment of the values in table 1200. Voltages are depicted for sensing memory cells on the neighbor word line (WLn+1) followed by reading memory cells on word line WLn. The bit lines are divided into Zone 1, Zone 2, Zone 3 and Zone 4, an example of which was discussed with respect to FIG. 12. FIG. 13 depicts an example in which Zone 1 contains the Erase and A states, Zone 2 contains the B and C states, Zone 3 contains the D and E states, and Zone 4 contains the F and G states. Moreover, FIG. 13 depicts an example in which a middle page of the target cells is read using VrA, VrC, and VrF. The waveforms may be modified to allow for other Zone assignments, as well as to read other pages.

Prior to time t1 the voltages are all at Vss, which may be 0V. Between time t1 and t2 a read spike voltage is applied to WLn+1. At t1 the voltage on WLn is raised up towards a read pass voltage VReadK/L. At t1 the voltages on all of the bit lines are raised to VBL. In an embodiment, VBL is a nominal sensing voltage. By t2 the voltage on WLn+1 has lowered to a first read reference voltage VrB. The voltage on WLn+1 is held at VrB until t3. The magnitude of VrB is selected to distinguish between Zone 1 and the other zones (Zone 2, 3, and 4). The neighbor cells are sensed between t2 and t3. In one embodiment, the sensing results are stored in one of the latches 340 (see FIG. 3C). For example, each ADL latch may store a 1/0 depending on the results. The voltage on WLn+1 is raised to VrD at t3 and held there until t4. The magnitude of VrD is selected to distinguish between Zone 1/2 and Zone 3/4. The neighbor cells are sensed between t3 and t4. In one embodiment, the sensing results are stored in one of the latches 340 (see FIG. 3C). For example, each BDL latch may store a 1/0 depending on the results. The voltage on WLn+1 is raised to VrF at t4 and held there until t5. The magnitude of VrF is selected to distinguish between Zone 4 and the other Zones (Zones 1, 2 and 3). The neighbor cells are sensed between t4 and t5. In one embodiment, the sensing results are stored in one of the latches 340 (see FIG. 3C). For example, each CDL latch may store a 1/0 depending on the results.

The voltage on WLn is held at VReadK/L at least until t5. Other unselected word lines will also have read pass voltages applied thereto, although the magnitude of the read pass voltages on the unselected word lines are not all required to be the same.

Between t5 and t6 another read spike voltage is applied to WLn+1. Also, voltages on WLn and the bit lines are brought back down to Vss by t6. Between t6 and t7 a read spike voltage is applied to WLn. At t6 the voltage on WLn+1 is raised to a read pass voltage VReadK.

Between t7 and t17 three different read reference voltages will be applied to WLn. These three read reference voltages (VrA, VrC, VrF) are used to read one of the three pages of data stored in the target memory cells on WLn. As one example, this is a middle page of data in an example in which the target cells store a lower page, a middle page, and an upper page. At t7 the voltage on WLn is raised towards the first reference voltage VrA. At t7 the voltage on the Zone 1 bit lines are raised to VBL_Z1_Low. A Zone 1 bit line is a bit line for which the neighbor cell on WLn+1 is in Zone 1. At t7 the voltage on the Zone 2 bit lines are raised to Z2_H1 (note that this corresponds to VBL_Z2_High1 in table 1200). A Zone 2 bit line is a bit line for which the neighbor cell on WLn+1 is in Zone 2. At t7 the voltage on the Zone 3 bit lines are raised to Z2_H1. A Zone 3 bit line is a bit line for which the neighbor cell on WLn+1 is in Zone 3. At t7 the voltage on the Zone 4 bit lines are raised to Z2_H1. A Zone 4 bit line is a bit line for which the neighbor cell on WLn+1 is in Zone 4. In one embodiment, the raising of the bit line voltages may be based on the status of one of the data latches 340. For example, the ADL latch may indicate whether the neighbor cell had a Vt above/below VrB. Those target cells having a neighbor cell with a Vt below VrB are Zone 1 cells. Those target cells having a neighbor cell with a Vt above VrB are either Zone 2, 3, or 4 cells.

At t9 the voltage on the Zone 3 bit lines are raised to Z3_H1. At t9 the voltage on the Zone 4 bit lines are raised to Z3_H1. In one embodiment, the raising of the bit line voltages may be based on the status of one of the data latches 340. For example, the BDL latch may indicate whether the neighbor cell had a Vt above/below VrD. Those target cells having a neighbor cell with a Vt below VrD are either Zone 1 or 2 cells. Those target cells having a neighbor cell with a Vt above VrD are either Zone 3 or 4 cells.

At t10 the voltage on the Zone 4 bit lines are raised to Z4_H1. In one embodiment, the raising of the bit line voltages may be based on the status of one of the data latches 340. For example, the CDL latch may indicate whether the neighbor cell had a Vt above/below VrF. Those target cells having a neighbor cell with a Vt below VrF are either Zone 1, 2 or 3 cells. Those target cells having a neighbor cell with a Vt above VrF are Zone 4 cells.

Between t10 and t11 the target cells on WLn are sensed while VrA is applied to WLn. Referring back to FIG. 12 note that for Zone 1 the voltage VBL_Z1_Low is applied for VrA, for Zone 2 the voltage VBL_Z2_High1 is applied for VrA, for Zone 3 the voltage VBL_Z3_High1 is applied for VrA, and for Zone 4 the voltage VBL_Z4_High1 is applied for VrA.

At t11 the voltage on WLn is raised towards the second reference voltage VrC. At t11 the voltage on the Zone 2 bit lines are lowered to Z2_H2 (note that this corresponds to VBL_Z2_High2 in table 1200). At t11 the voltage on the Zone 3 bit lines are lowered to Z2_H2. At t11 the voltage on the Zone 4 bit lines are lowered to Z2_H2. In one embodiment, the lowering of the bit line voltages may be based on the status of one of the data latches 340. For example, the ADL latch may indicate whether the neighbor cell had a Vt above/below VrB. Those target cells having a neighbor cell with a Vt below VrB are Zone 1 cells. Those target cells having a neighbor cell with a Vt above VrB are either Zone 2, 3, or 4 cells (and therefore have voltages lowered to Z2_H2).

At t12 the voltage on the Zone 3 bit lines are raised to Z3_H2. At t12 the voltage on the Zone 4 bit lines are raised to Z3_H2. In one embodiment, the raising of the bit line voltages may be based on the status of one of the data latches 340. For example, the BDL latch may indicate whether the neighbor cell had a Vt above/below VrD. Those target cells having a neighbor cell with a Vt below VrD are either Zone 1 or 2 cells. Those target cells having a neighbor cell with a Vt above VrD are either Zone 3 or 4 cells (and therefore have voltages raised to Z3_H2).

At t13 the voltage on the Zone 4 bit lines are raised to Z4_H2. In one embodiment, the raising of the bit line voltages may be based on the status of one of the data latches 340. For example, the CDL latch may indicate whether the neighbor cell had a Vt above/below VrF. Those target cells having a neighbor cell with a Vt below VrF are either Zone 1, 2 or 3 cells. Those target cells having a neighbor cell with a Vt above VrF are Zone 4 cells (and therefore have voltages raised to Z4_H2).

Between t13 and t14 the target cells on WLn are sensed while VrC is applied to WLn. Referring back to FIG. 12 note that for Zone 1 the voltage VBL_Z1_Low is applied for VrC, for Zone 2 the voltage VBL_Z2_High2 is applied for VrC, for Zone 3 the voltage VBL_Z3_High2 is applied for VrC, and for Zone 4 the voltage VBL_Z4_High2 is applied for VrC (these voltages correspond to those between t13 and t14).

At t14 the voltage on WLn is raised towards the third reference voltage VrF. At t14 the voltage on the Zone 2 bit lines are lowered to Z2_H4 (note that this corresponds to VBL_Z2_High4 in table 1200). At t14 the voltage on the Zone 3 bit lines are lowered to Z2_H4. At t14 the voltage on the Zone 4 bit lines are lowered to Z2_H4. In one embodiment, the lowering of the bit line voltages may be based on the status of one of the data latches 340. For example, the ADL latch may indicate whether the neighbor cell had a Vt above/below VrB. Those target cells having a neighbor cell with a Vt below VrB are Zone 1 cells. Those target cells having a neighbor cell with a Vt above VrB are either Zone 2, 3, or 4 cells (and therefore have voltages lowered to Z2_H4).

At t15 the voltage on the Zone 3 bit lines are raised to Z3_H4. At t15 the voltage on the Zone 4 bit lines are raised to Z3_H4. In one embodiment, the raising of the bit line voltages may be based on the status of one of the data latches 340. For example, the BDL latch may indicate whether the neighbor cell had a Vt above/below VrD. Those target cells having a neighbor cell with a Vt below VrD are either Zone 1 or 2 cells. Those target cells having a neighbor cell with a Vt above VrD are either Zone 3 or 4 cells (and therefore have voltages raised to Z3_H4).

At t16 the voltage on the Zone 4 bit lines are raised to Z4_H4. In one embodiment, the raising of the bit line voltages may be based on the status of one of the data latches 340. For example, the CDL latch may indicate whether the neighbor cell had a Vt above/below VrF. Those target cells having a neighbor cell with a Vt below VrF are either Zone 1, 2 or 3 cells. Those target cells having a neighbor cell with a Vt above VrF are Zone 4 cells (and therefore have voltages raised to Z4_H4).

Between t16 and t17 the target cells on WLn are sensed while VrF is applied to WLn. Referring back to FIG. 12 note that for Zone 1 the voltage VBL_Z1_Low is applied for VrF, for Zone 2 the voltage VBL_Z2_High4 is applied for VrF, for Zone 3 the voltage VBL_Z3_High4 is applied for VrF, and for Zone 4 the voltage VBL_Z4_High4 is applied for VrF (these voltages correspond to those between t16 and t17). In one embodiment, the middle page result for the target cell is stored in the XDL latch 348 (see FIG. 3C).

Therefore, for the example in FIG. 13, three of the four VBL_High voltages are used. Because sensing did not occur at VrD or VrE there was no need to apply VBL_High3 for reading this middle page. However, when reading a page for which VrD or VrE is applied to WLn, VBL_High3 will be applied to the Zone 2, 3, and 4 bit lines. Therefore, the lower page and the upper page may be read in a manner similar to that depicted for the middle page example in FIG. 13, with modifications taken from table 1200 depending on what reference voltages are applied to the target word line WLn to read the lower and upper pages. However, note that as mentioned above table 1200 is just one example of how to assign bit line voltages to read reference voltages.

Also note that in FIG. 13 the bit line voltages for Zone 3 and Zone 4 are ramped up in stages for sensing the target cells. As discussed above, this ramping in stages may be based on the content in the data latches 340. For example, the voltage on the Zone 4 bit lines are ramped to Z2_H1 starting at t7 (based on ADL), then ramped to Z3_H1 (based on BDL), and then to Z4_H1 (based on CDL). Therefore, at t10 the Zone 4 bit lines are already at Z3_H1 and do not have far to ramp up to Z4_H1. In other embodiments the ramping is not done in stages.

In view of the foregoing, a first embodiment includes an apparatus, comprising one or more control circuits configured to connect to a memory structure having strings having memory cells. The memory structure has word lines connected to the memory cells. The memory structure has bit lines associated with the strings. The one or more control circuits are configured to apply a read reference voltage to a target word line connected to target memory cells on a group of the strings. The one or more control circuits are configured to apply voltages to bit lines associated with the group of the strings while the read reference voltage is applied to the target word line. The voltage applied to a respective bit line has a magnitude that depends on a data state of a neighbor memory cell on the string associated with the respective bit line. The one or more control circuits are configured to sense the target memory cells in response to the application of the read reference voltage to the target word line and the application of the voltages to the respective bit lines.

In a second embodiment, in furtherance to the first embodiment, the voltage applied to a respective bit line has a magnitude that further depends on a magnitude of the read reference voltage applied to the target word line.

In a third embodiment, in furtherance to the first or second embodiments, the magnitude of the voltage applied to a respective bit line creates an amount of drain-induced barrier lowering (DIBL) in a target memory cell associated with the respective bit line that depends on the data state of the neighbor memory cell on the string associated with the respective bit line.

In a fourth embodiment, in furtherance to any of the first to third embodiments, the strings having memory cells are NAND strings having NAND memory cells. The one or more control circuits are further configured to program the neighbor memory cells to their respective data states after programming the target memory cells.

In a fifth embodiment, in furtherance any of the first to fourth embodiments, the strings having memory cells are NAND strings. The target memory cells comprise a first set of target memory cells on a first set of NAND strings and a second set of target memory cells on a second set of NAND strings. The first set of NAND strings are associated with a corresponding first set of bit lines. The second set of NAND strings are associated with a corresponding second set of bit lines. Each respective cell in the first set of target memory cells has a neighbor memory cell on the same NAND string as the respective cell in the first set. The neighbor memory cell to respective cell in the first set is connected to a neighbor word line adjacent to the target word line and is in a first set of data states. Each respective cell in the second set of target memory cells has a neighbor memory cell on the same NAND string as the respective cell in the second set. The neighbor memory cell to respective cell in the second set is connected to the neighbor word line and is in a second set of data states. The voltage applied to each respective bit line in the first set of bit lines has a first magnitude that creates a first amount of drain-induced barrier lowering (DIBL). The voltage applied to each respective bit line in the second set of bit lines has a second magnitude that creates a second amount of DIBL.

In a sixth embodiment, in furtherance to the fifth embodiment the target memory cells further comprise a third set of target memory cells on a third set of NAND strings and a fourth set of target memory cells on a fourth set of NAND strings. The third set of NAND strings are associated with a third set of bit lines. The fourth set of NAND strings are associated with a fourth set of bit lines Each respective cell in the third set of target memory cells has a neighbor memory cell on the same NAND string as the respective cell in the third set. The neighbor memory cell to respective cell in the third set is connected to the neighbor word line and is in a third set of data states. Each respective cell in the fourth set of target memory cells has a neighbor memory cell on the same NAND string as the respective cell in the fourth set. The neighbor memory cell to respective cell in the fourth set is connected to the neighbor word line and is in a fourth set of data states. The voltage applied to each respective bit line in the third set of bit lines has a third magnitude that creates a third amount of DIBL. The voltage applied to each respective bit line in the fourth set of bit lines has a fourth magnitude that creates a fourth amount of DIBL.

In a seventh embodiment, in furtherance to any of the first to sixth embodiments, the one or more control circuits are configured to sense neighbor memory cells connected to a neighbor word line that neighbors the target word line at one or more reference voltages. The one or more control circuits are configured to store a result from sensing at each of the one or more reference voltages in a different data latch. The one or more control circuits are configured to determine the voltage to apply to the bit lines connected to the group of the strings based on the results stored in the data latches.

In an eighth embodiment, in furtherance to any of the first to seventh embodiments, the apparatus further comprises a first semiconductor die comprising the memory structure and a second semiconductor die comprising the one or more control circuits, wherein the second semiconductor die is bonded to the first semiconductor die.

One embodiment includes a method for reading NAND memory cells. The method comprises applying a read reference voltage to a target word line connected to a first set of NAND memory cells and a second set of NAND memory cells. The target word line is adjacent to a neighbor word line having neighbor memory cells. Each respective cell in the first set has a neighbor memory cell on the same NAND string as the respective cell in the first set with the neighbor memory cell being in a first zone of data states. Each respective cell in the second set has a neighbor memory cell on the same NAND string as the respective cell in the second set the neighbor memory cell with being in a second zone of data states. The method comprises applying a first voltage to a first set of bit lines that are associated with the first set of memory cells while applying the read reference voltage to the target word line. The method comprises applying a second voltage to a second set of bit lines that are associated with the second set of memory cells while applying the read reference voltage to the target word line. The method comprises sensing the first set of memory cells in response to the read reference voltage applied to the target word line and the first voltage applied to the first set of bit lines. The method comprises sensing the second set of memory cells in response to the read reference voltage applied to the target word line and the second voltage applied to the second set of bit lines.

One embodiment includes a non-volatile storage system comprising a memory structure having a plurality of NAND strings having memory cells, word lines connected to the memory cells, and bit lines associated with the NAND strings. The non-volatile storage system comprises one or more control circuits in communication with the memory structure. The one or more control circuits are configured to sense neighbor memory cells connected to a neighbor word line that neighbors a target word line to determine which zone of data states each neighbor memory cell resides. The one or more control circuits are configured to sense a first set of memory cells connected to the target word line while creating a first amount of drain-induced barrier lowering (DIBL) in the first set of memory cells. The first set of memory cells each have a neighbor memory cell in a first zone of the data states. The one or more control circuits are configured to sense a second set of the memory cells connected to the target word line while creating a second amount of DIBL in the second set of memory cells. The second set of memory cells each have a neighbor memory cell in a second zone of the data states.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a memory structure having strings having memory cells, the memory structure having word lines connected to the memory cells, the memory structure having bit lines associated with the strings, wherein the one or more control circuits are configured to:
apply a read reference voltage to a target word line connected to target memory cells on a group of the strings;
apply voltages to bit lines associated with the group of the strings while the read reference voltage is applied to the target word line, wherein the voltage applied to a respective bit line has a magnitude that depends on a data state of a neighbor memory cell on the string associated with the respective bit line and further depends on a magnitude of the read reference voltage applied to the target word line, wherein for at least one neighbor data state the one or more control circuits are configured to apply different bit line voltages for different read reference voltages; and
sense the target memory cells in response to the application of the read reference voltage to the target word line and the application of the voltages to the respective bit lines.

2. The apparatus of claim 1, wherein the magnitude of the voltage applied to a respective bit line creates an amount of drain-induced barrier lowering (DIBL) in a target memory cell associated with the respective bit line that depends on the data state of the neighbor memory cell on the string associated with the respective bit line.

3. The apparatus of claim 1, wherein:
the strings having memory cells are NAND strings having NAND memory cells; and
the one or more control circuits are further configured to program the neighbor NAND memory cells to their respective data states after programming the target NAND memory cells.

4. The apparatus of claim 1, wherein:
the strings having memory cells are NAND strings;
the target memory cells comprise a first set of target memory cells on a first set of NAND strings and a second set of target memory cells on a second set of NAND strings, the first set of NAND strings are associated with a corresponding first set of bit lines, the second set of NAND strings are associated with a corresponding second set of bit lines;
each respective cell in the first set of target memory cells has a neighbor memory cell on the same NAND string as the respective cell in the first set, the neighbor memory cell to respective cell in the first set is connected to a neighbor word line adjacent to the target word line and is in a first set of data states;
each respective cell in the second set of target memory cells has a neighbor memory cell on the same NAND string as the respective cell in the second set, the neighbor memory cell to respective cell in the second set is connected to the neighbor word line and is in a second set of data states;
the voltage applied to each respective bit line in the first set of bit lines has a first magnitude that creates a first amount of drain-induced barrier lowering (DIBL); and
the voltage applied to each respective bit line in the second set of bit lines has a second magnitude that creates a second amount of DIBL.

5. The apparatus of claim 4, wherein:
the target memory cells further comprise a third set of target memory cells on a third set of NAND strings and a fourth set of target memory cells on a fourth set of NAND strings, the third set of NAND strings are associated with a third set of bit lines, the fourth set of NAND strings are associated with a fourth set of bit lines;
each respective cell in the third set of target memory cells has a neighbor memory cell on the same NAND string as the respective cell in the third set, the neighbor memory cell to respective cell in the third set is connected to the neighbor word line and is in a third set of data states;
each respective cell in the fourth set of target memory cells has a neighbor memory cell on the same NAND string as the respective cell in the fourth set, the neighbor memory cell to respective cell in the fourth set is connected to the neighbor word line and is in a fourth set of data states;
the voltage applied to each respective bit line in the third set of bit lines has a third magnitude that creates a third amount of DIBL; and
the voltage applied to each respective bit line in the fourth set of bit lines has a fourth magnitude that creates a fourth amount of DIBL.

6. The apparatus of claim 1, wherein the one or more control circuits are further configured to:
sense neighbor memory cells connected to a neighbor word line that neighbors the target word line at one or more reference voltages;
store a result from sensing at each of the one or more reference voltages in a different data latch; and determine the voltage to apply to the bit lines connected to the group of the strings based on the results stored in the data latches.

7. The apparatus of claim 1, further comprising:
a first semiconductor die comprising the memory structure; and
a second semiconductor die comprising the one or more control circuits, wherein the second semiconductor die is bonded to the first semiconductor die.

8. A method for reading NAND memory cells, the method comprising:
applying a first read reference voltage to a target word line connected to a first set of NAND memory cells and a second set of NAND memory cells, the target word line is adjacent to a neighbor word line having neighbor memory cells, wherein each respective cell in the first set has a neighbor memory cell on the same NAND string as the respective cell in the first set with the neighbor memory cell being in a first zone of data states, wherein each respective cell in the second set has a neighbor memory cell on the same NAND string as the respective cell in the second set with the neighbor memory cell being in a second zone of data states;
applying a first voltage to a first set of bit lines that are associated with the first set of memory cells while applying the read reference voltage to the target word line, the first voltage depending on the first zone of data states;
applying a second voltage to a second set of bit lines that are associated with the second set of memory cells while applying the read reference voltage to the target word line, the second voltage depending on the second zone of data states and a magnitude of the first read reference voltage;
sensing the first set of memory cells in response to the first read reference voltage applied to the target word line and the first voltage applied to the first set of bit lines;
sensing the second set of memory cells in response to the first read reference voltage applied to the target word line and the second voltage applied to the second set of bit lines;
modifying the first read reference voltage on the target word line to a second read reference voltage;
applying a third voltage to the second set of bit lines while applying the second read reference voltage to the target word line, the third voltage depending on the second zone of data states and a magnitude of the second read reference voltage; and
sensing the second set of memory cells in response to the second read reference voltage applied to the target word line and the third voltage applied to the second set of bit lines.

9. The method of claim 8, wherein:
applying the first voltage to a first bit line in the first set of bit lines creates a first amount of drain-induced barrier lowering (DIBL) in a first target memory cell associated with the first bit line; and
applying the second voltage to a second bit line in the second set of bit lines creates a second amount of DIBL in a second target memory cell associated with the second bit line, wherein the second amount of DIBL is different from the first amount of DIBL.

10. The method of claim 8, further comprising:
programming the memory cells on the neighbor word line to their respective data states after programming the memory cells on the target word line.

11. The method of claim 8, further comprising:
applying a fourth voltage to a third set of bit lines that are associated with a third set of memory cells while applying the first read reference voltage to the target word line, wherein each respective cell in the third set has a neighbor memory cell on the same NAND string as the respective cell in the third set with the neighbor memory cell being in a third zone of data states;
applying a fifth voltage to a fourth set of bit lines that are associated with a fourth set of memory cells while applying the first read reference voltage to the target word line, wherein each respective cell in the fourth set has a neighbor memory cell on the same NAND string as the respective cell in the fourth set with the neighbor memory cell being in a fourth zone of data states;
sensing the third set of memory cells in response to the first read reference voltage applied to the target word line and the fourth voltage applied to the third set of bit lines; and
sensing the fourth set of memory cells in response to the first read reference voltage applied to the target word line and the fifth voltage applied to the fourth set of bit lines.

12. The method of claim 8, further comprising:
sensing the memory cells on the neighbor word line at a plurality of reference voltages;
storing a result from sensing at each reference voltage in a different data latch; and
determining a magnitude of the first voltage for the first set of bit lines and the second voltage for the second set of bit lines based on the results in the latches.

13. A non-volatile storage system comprising:
a memory structure having a plurality of NAND strings having memory cells, word lines connected to the memory cells, and bit lines associated with the NAND strings; and
one or more control circuits in communication with the memory structure, wherein the one or more control circuits are configured to:
sense neighbor memory cells connected to a neighbor word line that neighbors a target word line connected to selected memory cells to determine which zone of data states each neighbor memory cell resides;
apply a first read reference voltage to the target word line while applying a first bit line voltage to first bit lines connected to first selected memory cells having a neighbor memory cell in a first zone of the data states, a magnitude of the first bit line voltage depends on the first read reference voltage;
sense the first selected memory cells in response to the first read reference voltage while applying the first bit line voltage to the first bit lines;
modify the voltage on the target word line from the first read reference voltage to a second read reference voltage;
modify the voltage on the first bit lines from the first bit line voltage to a second bit line voltage, the magnitude of the second bit line voltage depends on the second read reference voltage; and
sense the first selected memory cells while applying the second read reference voltage to the target word line and while applying the second bit line voltage to the first bit lines.

* * * * *